(12) United States Patent
Wells et al.

(10) Patent No.: US 11,515,463 B1
(45) Date of Patent: Nov. 29, 2022

(54) TRANSPARENT ELECTROSTRICTIVE ACTUATORS

(71) Applicant: META PLATFORMS TECHNOLOGIES, LLC, Menlo Park, CA (US)

(72) Inventors: Spencer Allan Wells, Seattle, WA (US); Katherine Marie Smyth, Seattle, WA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 692 days.

(21) Appl. No.: 16/554,659

(22) Filed: Aug. 29, 2019

(51) Int. Cl.
| | |
|---|---|
| H01L 41/047 | (2006.01) |
| H01L 41/083 | (2006.01) |
| H01L 41/273 | (2013.01) |
| H01L 41/187 | (2006.01) |

(52) U.S. Cl.
CPC ...... *H01L 41/0472* (2013.01); *H01L 41/0838* (2013.01); *H01L 41/187* (2013.01); *H01L 41/273* (2013.01); *H01L 41/1875* (2013.01); *H01L 41/1876* (2013.01); *H01L 41/1878* (2013.01)

(58) Field of Classification Search
None
See application file for complete search history.

(56) References Cited

U.S. PATENT DOCUMENTS 3,963,630 A * 6/1976 Yonezawa ............ C01G 23/003
423/598

FOREIGN PATENT DOCUMENTS

EP 1367036 A2 * 12/2003 ............. B32B 18/00

OTHER PUBLICATIONS

"Mechanical Reinforcement and Piezoelectric Properties of PZT Ceramics Embedded with NanoCrystalline" by Wang et al. (Year: 2010).*
Zhou et al., "Abnormal electric-field-induced light scattering in Pb(Mg1/3Nb2/3)O3—PbTiO3 transparent ceramics", Applied Physics Letters, vol. 106, 2015, 4 pages.
Zhang et al., "Comparison of PMN-PT transparent ceramics processed by three different sintering methods", J Mater Sci: Mater Electron, vol. 28, 2017, pp. 15612-15617.
Zhao et al., "Domain dynamics of La-doped PMN-PT transparent ceramics studied by piezoresponse force microscope", Applied Surface Science, vol. 293, 2014, pp. 366-370.

(Continued)

*Primary Examiner* — Evren Seven
(74) *Attorney, Agent, or Firm* — FisherBroyles, LLP

(57) ABSTRACT

An optical element includes a primary electrode, a secondary electrode overlapping at least a portion of the primary electrode, and an electrostrictive ceramic layer disposed between and abutting the primary electrode and the secondary electrode, where the electrostrictive ceramic may be characterized by a relative density of at least approximately 99%, an average grain size of at least approximately 300 nm, a transmissivity within the visible spectrum of at least approximately 70%, and bulk haze of less than approximately 10%. Optical properties of the electrostrictive ceramic may be substantially unchanged during the application of a voltage to the electrostrictive ceramic layer and the attendant actuation of the optical element.

19 Claims, 16 Drawing Sheets

(56) References Cited

OTHER PUBLICATIONS

Okazaki et al., "Effects of Grain Size and Porosity on Electrical and Optical Properties of PLZT Ceramics", J. Am. Cer. Soc., vol. 56, No. 2, Feb. 1973, pp. 82-86.
Ji et al., "Effect of PNM/PT ratio on optical and electro-optic properties of PLMNT transparent ceramics", Science Direct, Ceramics International, vol. 41, 2015, pp. 10387-10393.
Zhou et al., "Electric Field-Induced Light Scattering in Eu-Doped PMN-PT Transparent Ceramics", J. Am. Ceram. Soc., 2016, pp. 1-7.
Xia et al., "Electrically induced light scattering performances of lanthanum-modified lead zirconate titanate transparent ceramics", J Electroceram, vol. 29, 2012, pp. 192-197.
Qu et al., "Evolution of nanodomains during the electric-field-induced relaxor to normal ferroelectric phase transition in a Sc-doped Pb ( Mg 1/3 Nb 2/3) O 3 ceramic", Journal of Applied Physics, vol. 102, 2007, 8 pages.
Haertling, Gene H., "PLZT electrooptic materials and applications—a review", Ferroelectrics, vol. 75, No. 1, 1987, pp. 25-55.
Masuda et al., "Light scattering and domain structure of ferroelectric PLZT family ceramics", Ferroelectrics, vol. 172, No. 1, 1995, pp. 243-252.
Li et al., "Local Structural Heterogeneity and Electromechanical Responses of Ferroelectrics: Learning from Relaxor Ferroelectrics", Advanced Functional Materials, 2018, pp. 1-21.
Perantie et al., "Temperature characteristics and development of field-induced phase transition in relaxor ferroelectric Pb(Mg1/3Nb2/3)0.87 Ti0.13 O3 ceramics", Applied Physics Letters, vol. 93, 2008, 3 pages.
Zhao et al., "Observation of an unusual optical switching effect in relaxor ferroelectrics Pb(Mg1/3Nb2/3)O3—Pb(Zr0.53, Ti0.47)O3 transparent ceramics", Applied Physics Letters, vol. 104, 2014, 5 pages.
Land, C.E., "Optical Information Storage and Spatial Light Modulation in PLZT Ceramics", Optical Engineering, vol. 17, No. 4, Jul.-Aug. 1978, pp. 317-326.
Bokov et al., "Recent progress in relaxor ferroelectrics with perovskite structure", Journal of Materials Science, vol. 41, 2006, pp. 31-52.
Ruan et al., "Large Electro-Optic Effect in La-Doped 0.75Pb(Mg1/3Nb2/3)O3—0.25PbTiO3 Transparent Ceramic by Two-Stage Sintering", J. Am. Ceram. Soc., vol. 93, No. 8, 2010, pp. 2128-2131.
Smith et al., "Scattering-Mode FerroelectricPhotoconductor Image Storage and Display Devices", Appl. Phys. Lett., vol. 20, No. 4, Feb. 15, 1972, pp. 169-171.
Shvartsman et al., "Evolution of nanodomains in 0.9PbMg1/3Nb2/3O3—0.1PbTiO3 single crystals", Journal of Applied Physics, vol. 101, 2007, 5 pages.
Song et al., "Fabrication and ferroelectric/dielectric properties of La-doped PMN-PT ceramics with high optical transmittance", Ceramics International, 2016, pp. 1-6.
Zhang et al., "Temperature Dependence of Electric-induced Light Scattering Performance for PLZT Ceramics", J. Am. Ceram. Soc., vol. 97, No. 5, 2014, pp. 1389-1392.
Li et al., "The effect of domain structures on the transparency of PMN-PT transparent ceramics", Optical Materials, vol. 35, 2013, pp. 722-726.
Zeng et al., "The influence of domain structure on the optical and electrical properties of transparent (Pb,La) (Mg1/3Nb2/3)O3—PbTiO3 ceramics", Science Direct, Ceramics International, vol. 39, 2013, pp. S31-S34.
Sternberg, A., "Transparent ferroelectric ceramics—recent trends and status Quo", Ferroelectrics, vol. 131, No. 1, 1992, pp. 13-23.

\* cited by examiner

TRANSPARENT ELECTROSTRICTIVE ACTUATORS

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
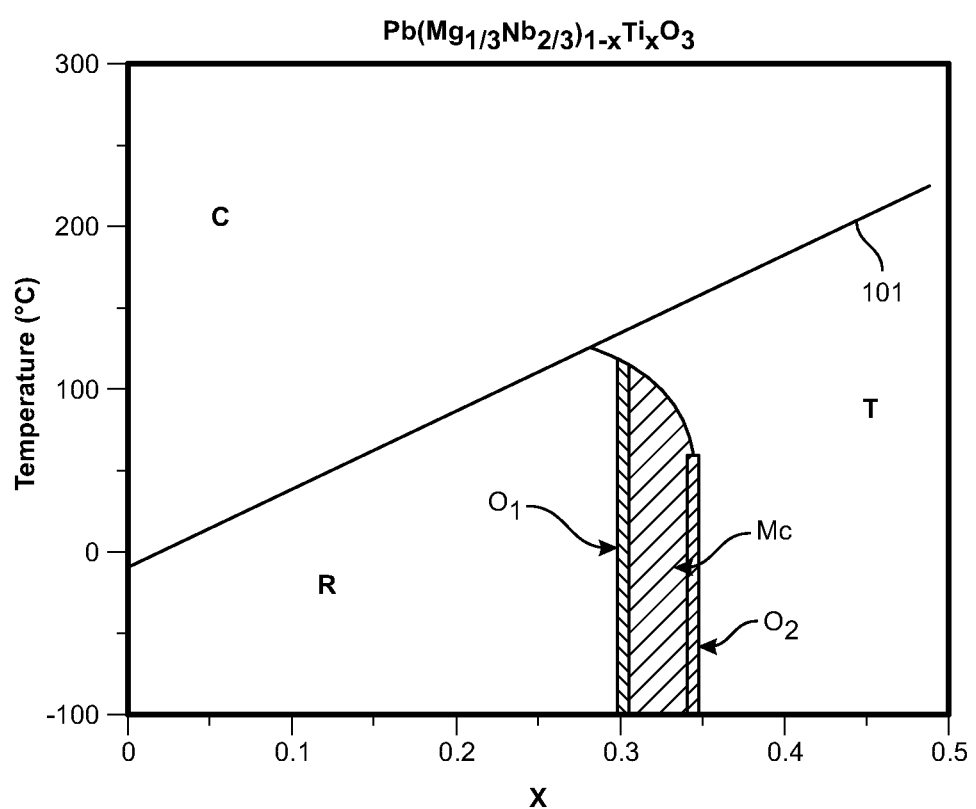
FIG. 1 is an equilibrium phase diagram of an example electrostrictive ceramic according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Ceramic and other dielectric materials may be incorporated into a variety of optic and electro-optic device architectures, including active and passive optics and electroactive devices. Electroactive materials, including electrostrictive ceramics, may change their shape under the influence of an external electric field. Electroactive materials have been investigated for use in various technologies, including actuation, sensing and/or energy harvesting. Lightweight and conformable, electroactive ceramics may be incorporated into wearable devices such as haptic devices and are attractive candidates for emerging technologies including virtual reality/augmented reality devices where a comfortable, adjustable form factor is desired.

Virtual reality and augmented reality eyewear devices or headsets may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of electroactive materials, including the refractive index to manipulate light. Example virtual reality/augmented reality assemblies containing electroactive layers may include deformable optics, such as mirrors, lenses, or adaptive optics. Deformation of the electroactive ceramic may be used to actuate optical elements in an optical assembly, such as a lens system.

Although thin layers of many electroactive ceramics can be intrinsically transparent, in connection with their incorporation into an optical assembly or optical device, a variation in refractive index between such materials and adjacent layers, such as air, may cause light scattering and a corresponding degradation of optical quality or performance. In a related vein, electroactive ferroelectric ceramic materials may spontaneously polarize in different directions forming domains and associated birefringent boundaries that scatter light. Further sources of optical scattering in these materials may include porosity and grain boundaries. Thus, notwithstanding recent developments, it would be advantageous to provide ceramic or other dielectric materials having improved actuation characteristics, including a controllable and robust deformation response in an optically transparent package.

As will be described in greater detail below, the instant disclosure relates to actuatable and transparent optical elements and methods for forming such optical elements. The optical elements may include a layer of an electrostrictive material sandwiched between conductive electrodes. The electrostrictive layer may be capacitively actuated to deform an optical element and hence modify its optical performance. By configuring an electrostrictive ceramic to have a substantially pore-free microstructure, the probability of a scattering event can be decreased, thereby improving optical quality. In certain embodiments, an optical element may be located within the transparent aperture of an optical device such as a liquid lens, although the present disclosure is not particularly limited and may be applied in a broader context. By way of example, the optical element may be incorporated into an active grating, tunable lens, accommodative optical element, or adaptive optics and the like. According to various embodiments, the optical element may be optically transparent.

As used herein, a material or element that is "transparent" or "optically transparent" may, for example, have a transmissivity within the visible light spectrum of at least approximately 70%, e.g., approximately 70, 80, 90, 95, 97, 98, 99, or 99.5%, including ranges between any of the foregoing values, and less than approximately 10% bulk haze, e.g., approximately 0.5, 1, 2, 4, 6, or 8% bulk haze, including ranges between any of the foregoing values. In accordance with some embodiments, a "fully transparent" material or element may have a transmissivity (i.e., optical transmittance) within the visible light spectrum of at least approximately 70%, e.g., approximately 70, 80, 90, 95, 97, 98, 99, or 99.5%, including ranges between any of the foregoing values, less than approximately 10% bulk haze, e.g., approximately 0.5, 1, 2, 4, 6, or 8% bulk haze, including ranges between any of the foregoing values, less than approximately 30% reflectivity, e.g., approximately 1, 2, 5, 10, 20, or 25% reflectivity, including ranges between any of the foregoing values, and at least 70% optical clarity, e.g., approximately 70, 80, 90, 95, 97, 98, 99, or 99.5% optical clarity, including ranges between any of the foregoing values. Transparent and fully transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

As used herein, "electroactive" materials, including electrostrictive materials may, in some examples, refer to materials that exhibit a change in size or shape when stimulated by an external electric field. In the presence of an electric field (E-field), an electrostrictive material may deform (e.g., compress, elongate, bend, etc.) according to the magnitude and direction of the applied field.

In accordance with various embodiments, when exposed to an external electric field, an accumulated displacement of ions within an "electrostrictive" ceramic may produce an overall strain (elongation) in the direction of the field. That is, positive ions may be displaced in the direction of the field and negative ions displaced in the opposite direction. In turn, the thickness of the electrostrictive ceramic may be decreased in one or more orthogonal directions, as characterized by the Poisson's ratio.

Generation of such an electric field may be accomplished, for example, by placing the electroactive (e.g., electrostrictive) material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electric field, the electrostrictive material may be in its relaxed state undergoing no induced deformation, or stated equivalently, no induced strain, either internal or external.

In some instances, the physical origin of the deformation of electrostrictive materials in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and elastic compliance of the electrostrictive material. Compliance in this case is the change of strain with respect to stress or, analogously, in more practical terms, the change in displacement with respect to force. In some embodiments, an electrostrictive layer may be pre-strained (or pre-stressed) to modify the stiffness of the optical element and hence its actuation characteristics.

According to various embodiments, the electrostrictive layer may include a transparent ceramic material and the electrodes may each include one or more layers of any suitable conductive material, such as transparent conductive oxides (e.g., TCOs such as ITO), graphene, etc. For instance, the ceramic layer may include a transparent polycrystalline ceramic or a transparent single crystal ceramic. In some embodiments, a polycrystalline electrostrictive ceramic may have a relative density of at least approximately 99%, e.g., 99%, 99.5%, 99.9%, 99.95%, 99.99%, 99.995%, or 99.999%, including ranges between any of the foregoing values, and an average grain size of at least approximately 300 nm, e.g., 300 nm, 400 nm, 500 nm, 1000 nm, or 2000 nm, including ranges between any of the foregoing values.

Example electrostrictive ceramics may include one or more ferroelectric ceramics, as well as solid solutions or mixtures thereof. Typically, ferroelectric materials are characterized by high dielectric permittivity values, where the temperature of the maximum real dielectric permittivity corresponds to the ferroelectric-paraelectric phase transition temperature. The so-called relaxor ferroelectrics, on the other hand, may exhibit a more elaborate dielectric response. Relaxor ferroelectrics may be characterized by (i) wide peaks in the temperature dependence of the dielectric permittivity, (ii) a frequency-dependent dielectric permittivity, where the temperature of the respective maxima for the real and imaginary components of the permittivity appear at different values, and (iii) a temperature of the maximum in the real dielectric permittivity that may be independent of the ferroelectric-paraelectric phase transition temperature.

The origin of relaxor behavior in ferroelectrics may be attributed to a positional disorder of cations on A or B sites of the perovskite blocks that delay the evolution of long-rage polar ordering. Commonly, the localized disorder in relaxor compounds may attributed to their complex and disordered chemical structure, where multiple atoms may substitute on one atomic site. In the example of lead magnesium niobium oxide, for instance, both magnesium and niobium can occupy the same position in the crystal lattice. As a further example, lead zirconate titanate (PZT) is a typical ferroelectric perovskite showing a conventional FE-PE phase transition. However, the partial substitution of different elements, such as lanthanum or samarium, may increase disorder within the material and induce relaxor characteristics. Moreover, in accordance with some embodiments, for some lanthanum or samarium concentrations, the distortion of the PZT crystalline lattice due to ion displacement may promote the formation of polar nanoregions (PNRs), which may inhibit the formation of long-range ferroelectric domains. For some compositions, polar nanoregions that are present under zero applied field may beneficially persist through an applied field of at least 2 V/micrometer, e.g., at least 0.5, 1, 1.5, or 2 V/micrometer, including ranges between any of the foregoing values, whereas other compositions having polar nanoregions under zero applied field (e.g., PLZT) may undergo a field-induced relaxor to ferroelectric phase transformation, which may adversely impact one or more optical properties.

According to various embodiments, relaxor compositions and other electrostrictive materials may have macroscopic cubic symmetry and/or may include non-cubic, polar nanoregions of sufficiently small size that the magnitude of resultant scattering from light traveling from the cubic matrix into the polar nanoregions does not appreciably degrade the optical properties of the material.

In accordance with various embodiments, example electrostrictive ceramics may include one or more compositions from the relaxor-PT-based family, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), ternary crystals such as $Pb(Zn_{1/3}Nb_{2/3})O_3$—$PbTiO_3$—$BaTiO_3$ (PZN-PT-BT), and the like. Generally, lead-based relaxor materials may be represented by the formula $Pb(B_1B_2)O_3$, where $B_1$ may include $Mg^{2+}$, $Zn^{2+}$, $Ni^{2+}$, $Sc^{3+}$, $Fe^{3+}$, $Yb^{3+}$, $In^{3+}$, etc. and $B_2$ may include $Nb^{5+}$, $Ta^{5+}$, $W^{6+}$, etc., although other relaxor compositions are contemplated.

The equilibrium phase diagram for $Pb(Mg_{1/3}Nb_{2/3})O_3$—$PbTiO_3$ (PMN-PT), for example, is shown in FIG. 1. As will be appreciated, PMN-PT and other relaxor-PT-based ceramics may be polymorphic. With increasing PT content (X), at room temperature (23° C.), PMN-PT exhibits rhombohedral (R), orthorhombic (O1), monoclinic (Mc), orthorhombic (O2), and tetragonal (T) phases. At temperatures above phase boundary 101, PMN-PT also exhibits a high temperature cubic (C) phase.

Further electrostrictive ceramic compositions include barium titanium zirconium oxide, barium titanium tin oxide, barium strontium titanium oxide, barium zirconium oxide, lead magnesium titanium oxide, lead magnesium niobium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, bismuth zinc tantalum oxide, and combinations thereof.

According to various embodiments, any of the foregoing ceramic compositions may be further combined with one or more of strontium titanium oxide, calcium titanium oxide, lead titanium oxide, lead zirconium titanium oxide, barium titanium oxide, bismuth iron oxide, sodium bismuth titanium oxide, bismuth scandium oxide, bismuth titanium oxide, lithium tantalum oxide, sodium potassium niobium oxide, and lithium niobium oxide. Moreover, the electrostrictive ceramic compositions may further include one or more dopants such as niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

Figure 2:
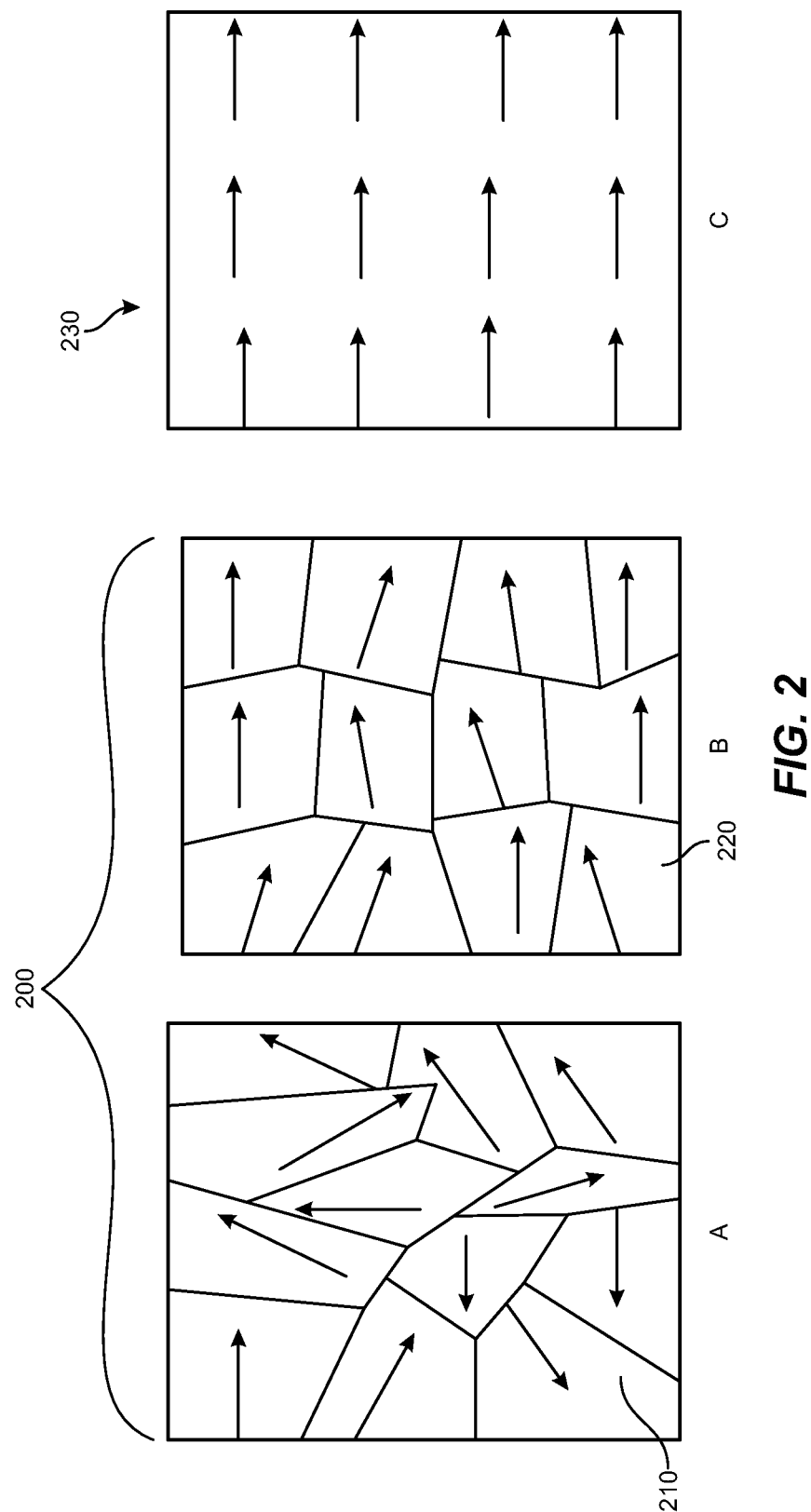
FIG. 2 is a schematic illustration of an electrostrictive ceramic having (A) randomly-oriented grains, (B) a textured polycrystalline microstructure, and (C) a single crystal microstructure according to various embodiments.

In accordance with some embodiments, the various ceramic phases may be polycrystalline or single crystal. Referring to FIG. 2, polycrystalline structures 200 may include disparately (randomly) oriented grains 210, as shown in FIG. 2A, or grains 220 having a non-random, preferred crystallographic orientation, as shown in FIG. 2B. In certain embodiments, the preferential alignment of grains within a polycrystalline electrostrictive ceramic may originate during synthesis, e.g., by applying an anisotropic force, such as hot isostatic pressing during compaction and sintering of suitable precursor powders. An example single crystal structure 230, which may be regarded as a subcategory of materials having a preferred crystallographic orientation, is shown in FIG. 2C.

Electrostrictive materials, including polycrystalline ceramics, may be formed by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 µm) particles. In this regard, substitution via doping of $Pb^{2+}$ at A and B-site vacancies with $La^{2+}$ and/or $Ba^{2+}$ may be used to increase the transparency of perovskite ceramics such as PZN-PT and PMN-PT.

According to some embodiments, ultrafine particle precursors can be fabricated via wet chemical methods, such as chemical co-precipitation, sol-gel and gel combustion. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while controlling grain growth during sintering. Sintered ceramics may be cut to a desired final shape and thinning via lapping and/or polishing may be used to decrease surface roughness to achieve thin, highly optically transparent layers that are suitable for high displacement actuation.

In addition to the foregoing, single crystal ceramics may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes may be formed directly on the wafer, e.g., using chemical vapor deposition or a physical vapor deposition process such as sputtering or evaporation. According to some embodiments, an electrostrictive layer may have an RMS surface roughness of less than approximately 50 nm. The electrostrictive ceramic may be poled to achieve a desired dipole alignment.

In certain embodiments, the electrostrictive ceramics disclosed herein may be substantially free of secondary phases, i.e., may contain less than approximately 1% by volume of any secondary phase, including porosity, e.g., less than 1%, less than 0.5%, less than 0.2%, less than 0.1%, less than 0.05%, less than 0.02%, less than 0.01%, less than 0.005%, less than 0.002%, or less than 0.001%, including ranges between any of the foregoing values. In some embodiments, the disclosed electrostrictive ceramics may be birefringent, which may be attributable to the material including plural distinct domains (e.g., polar nanoregions) or regions of varying polarization having different refractive indices.

According to various embodiments, a relaxor ceramic may include discrete (localized) regions of polar, i.e., non-cubic, material in a matrix having cubic symmetry. According to some embodiments, the polar nanoregions may have at least one dimension (length, width, or depth) of less than approximately 100 nm, e.g., less than 100 nm, less than 50 nm, less than 40 nm, less than 30 nm, less than 20 nm, less than 10 nm, or less than 5 nm, including ranges between any of the foregoing values. Thus, electrostrictive (relaxor) ceramics may, according to some embodiments, be characterized by cubic or pseudocubic symmetry.

Figure 3:
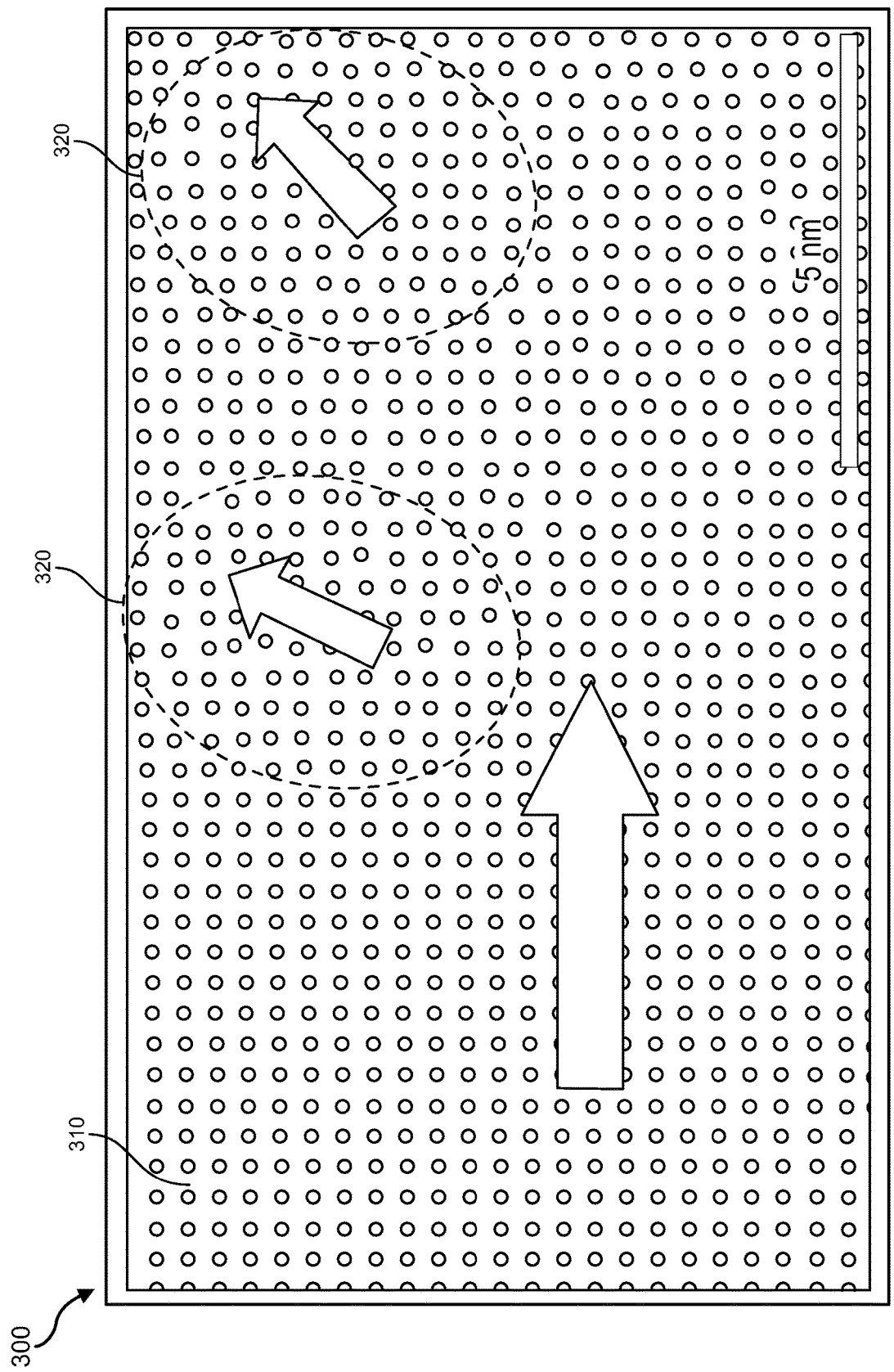
FIG. 3 is a schematic illustrating polar nanoregions within an electrostrictive ceramic according to various embodiments.

Referring to FIG. 3, shown is a schematic diagram depicting the microstructure of a relaxor ceramic that includes polar nanoregions according to certain embodiments. The ceramic material 300 may include a cubic matrix 310 with localized polar regions 320 having non-cubic symmetry.

Figure 4:
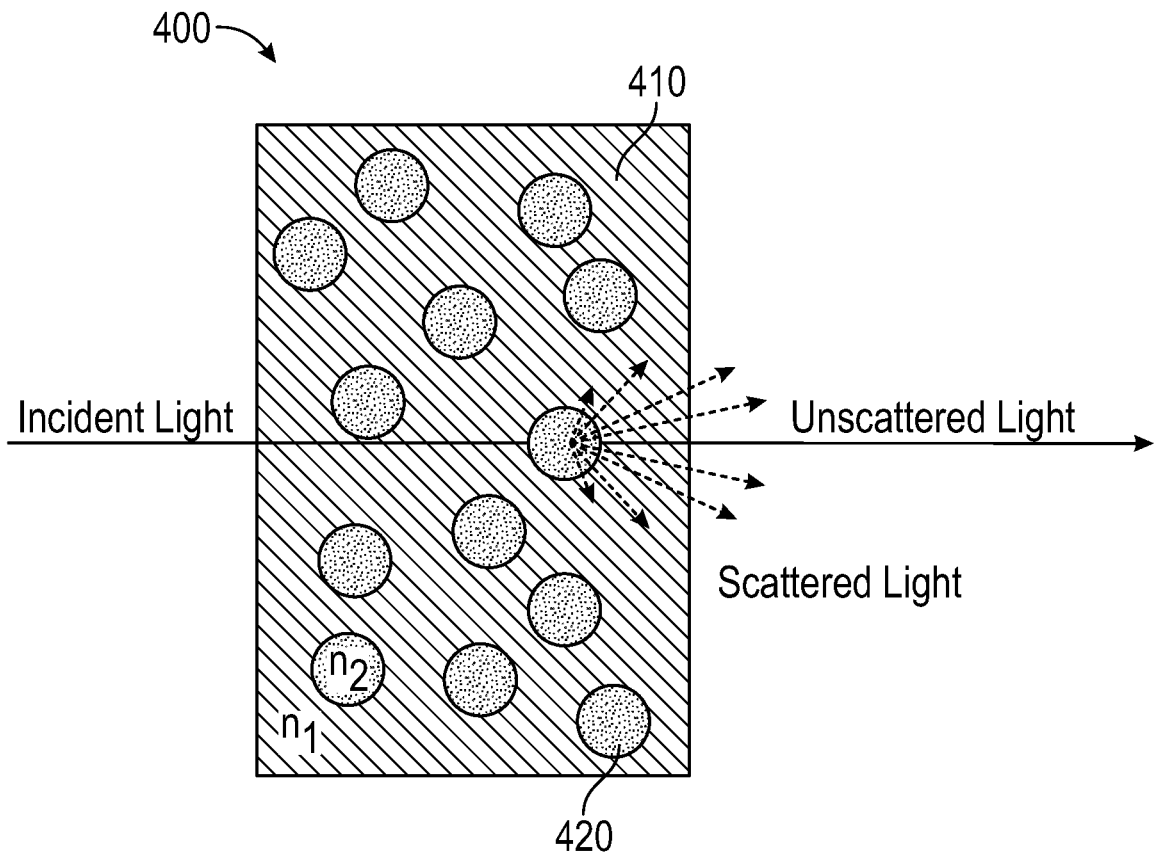
FIG. 4 shows optical scattering from discrete domains located within an example electrostrictive ceramic according to some embodiments.

Referring to FIG. 4, the propagation of light through such electrostrictive materials may be modeled by calculating scattering using the full Mie scattering solution of independent particles, where electrostrictive material layer 400 may include a ceramic matrix 410 and plural ferroelectric domains (e.g., polar nanodomains) 420 dispersed throughout the matrix 410. Matrix 410 may have a refractive index tensor n1, while domains 420 may have a refractive index tensor n2.

Figure 5:
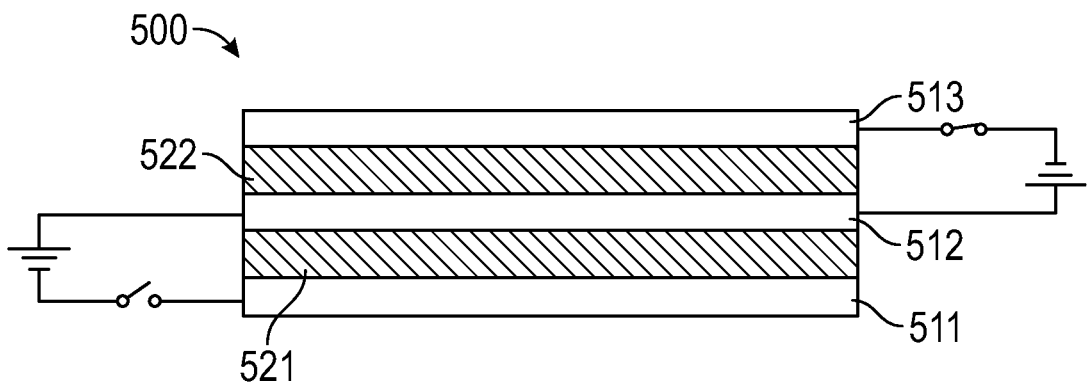
FIG. 5 is a schematic diagram of an example optically transparent bimorph actuator according to some embodiments.

As disclosed herein, an optical element may include a layer of an electrostrictive material disposed between conductive electrodes. Referring to FIG. 5, in accordance with various embodiments, an optical element 500 may include a primary electrode 511, a secondary electrode 512 overlapping at least a portion of the primary electrode, and a first electrostrictive layer 521 disposed between and abutting the primary electrode 511 and the secondary electrode 512, where the optical element 500 is optically transparent. In the illustrated embodiment, the disclosed bimorph architecture may further include a second electrostrictive layer 522 disposed over the secondary electrode 512, and a tertiary electrode 513 disposed over the second electrostrictive layer 522, i.e., opposite to and overlapping at least a portion of the secondary electrode 512.

In the illustrated multilayer actuator, according to various embodiments, the various electrostrictive layers (e.g., first electrostrictive layer 521 and second electrostrictive layer 522) may be actuated independently, as shown in FIG. 5, or concurrently.

In some embodiments, optical elements may include paired electrodes, which allow the creation of the electrostatic field that forces displacement of the electrostrictive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc oxide, indium gallium zinc tin oxide, strontium vanadate, strontium niobate, strontium molybdate, calcium molybdate, and indium zinc tin oxide.

In some embodiments, the electrode or electrode layer may be self-healing, such that damage from local shorting of a circuit can be isolated. Suitable self-healing electrodes may include thin films of materials which deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electrostrictive material. A tertiary electrode may overlap at least a portion of either the primary or secondary electrode.

An optical element may include a first electrostrictive layer, which may be disposed between a first pair of electrodes (e.g., the primary electrode and the secondary electrode). A second optical element, if used, may include a second electrostrictive layer and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include a metal such as aluminum, graphene, carbon nanotubes, etc. In other embodiments, relatively rigid electrodes (e.g., electrodes including one or more transparent conducting oxides (TCOs) such as indium oxide, tin oxide, indium tin oxide (ITO), indium gallium zinc oxide (IGZO), and the like) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electrostrictive material may be deposited directly on to an electrode. In some embodiments, an electrode may be deposited directly on to the electrostrictive material. In some embodiments, electrodes may be prefabricated and attached to an electrostrictive material. In some embodiments, an electrode may be deposited on a substrate, for example a glass substrate or flexible polymer film. In some embodiments, the electrostrictive material layer may directly abut an electrode. In some embodiments, there may be an insulating layer, such as a dielectric layer, between a layer of electrostrictive material and an electrode.

The electrodes may be used to affect large scale deformation, i.e., via full-area coverage, or the electrodes may be patterned to provide spatially localized stress/strain profiles. In particular embodiments, a deformable optical element and an electrostrictive layer may be co-integrated whereby the deformable optic may itself be actuatable. In addition, various methods of forming optical elements are disclosed, including solution-based and solid-state deposition techniques.

As will be appreciated, the methods and systems shown and described herein may be used to form transparent actuators having a single layer or multiple layers of an electrostrictive material (e.g., a few layers to tens, hundreds, or thousands of stacked layers). For example, a transparent actuators may include a stack of from two electrostrictive ceramic layers and corresponding electrodes to thousands of electrostrictive ceramic layers (e.g., approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 layers, including ranges between any of the foregoing values). A large number of layers may be used to achieve a high displacement output, where the overall device displacement may be expressed as the sum of the displacement of each layer. Such complex arrangements can enable compression, extension, twisting, and/or bending when operating the actuator.

In accordance with certain embodiments, a transparent actuator including an electrostrictive layer disposed between transparent electrodes may be incorporated into a variety of device architectures where capacitive actuation and the attendant strain realized in the electrostrictive layer (e.g., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional. In some embodiments, the engineered deformation of two or more electrostrictive layers that are alternatively placed in expansion and compression by oppositely applied voltages may be used to induce bending or curvature changes in a device stack, which may be used to provide optical tuning such as focus or aberration control.

In some applications, a transparent electrostrictive actuator used in connection with the principles disclosed herein may include a primary electrode, a secondary electrode, and an electrostrictive layer disposed between the primary electrode and the secondary electrode. In some embodiments, there may be one or more additional electrodes, and a common electrode may be electrically coupled to one or more of the additional electrodes. For example, plural actuators may be disposed in a stacked configuration, with a first common electrode coupled to a first plurality of electrodes, and a second common electrode electrically connected to a second plurality of electrodes.

In some embodiments, a transparent electrostrictive actuator (i.e., one or more layers of an electrostrictive ceramic disposed between and abutting respective electrodes) may have a thickness of approximately 10 nm to approximately 300 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8 µm, approximately 9 µm, approximately 10 µm, approximately 20 µm, approximately 50 µm, approximately 100 µm, approximately 200 µm, or approximately 300 µm), with an example thickness of approximately 200 nm to approximately 500 nm.

The application of a voltage between the electrodes can cause compression or expansion of the intervening electrostrictive layer(s) in the direction of the applied electric field and an associated expansion or contraction of the electrostrictive layer(s) in one or more transverse dimensions. In some embodiments, an applied voltage (e.g., to the primary electrode and/or the secondary electrode) may create at least approximately 0.02% strain (e.g., an amount of deformation in the direction of the applied force resulting from the applied voltage divided by the initial dimension of the material) in the electrostrictive element(s) in at least one direction (e.g., an x, y, or z direction with respect to a defined coordinate system).

The optical element may be deformable from an initial state to a deformed state when a first voltage is applied between the primary electrode and the secondary electrode and may further be deformable to a second deformed state when a second voltage is applied between the primary electrode and the secondary electrode. In some embodiments, the deformation response may include a mechanical response to the electrical input that varies over the spatial extent of the device, with the electrical input being applied between the primary electrode and the secondary electrode. The mechanical response may be termed an actuation, and example devices or optical elements may be, or include, actuators.

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electrostrictive layer between the primary and secondary electrodes. A non-uniform electroactive response may include a curvature of a surface of the optical element, which may in some embodiments be a compound curvature.

Figure 6:
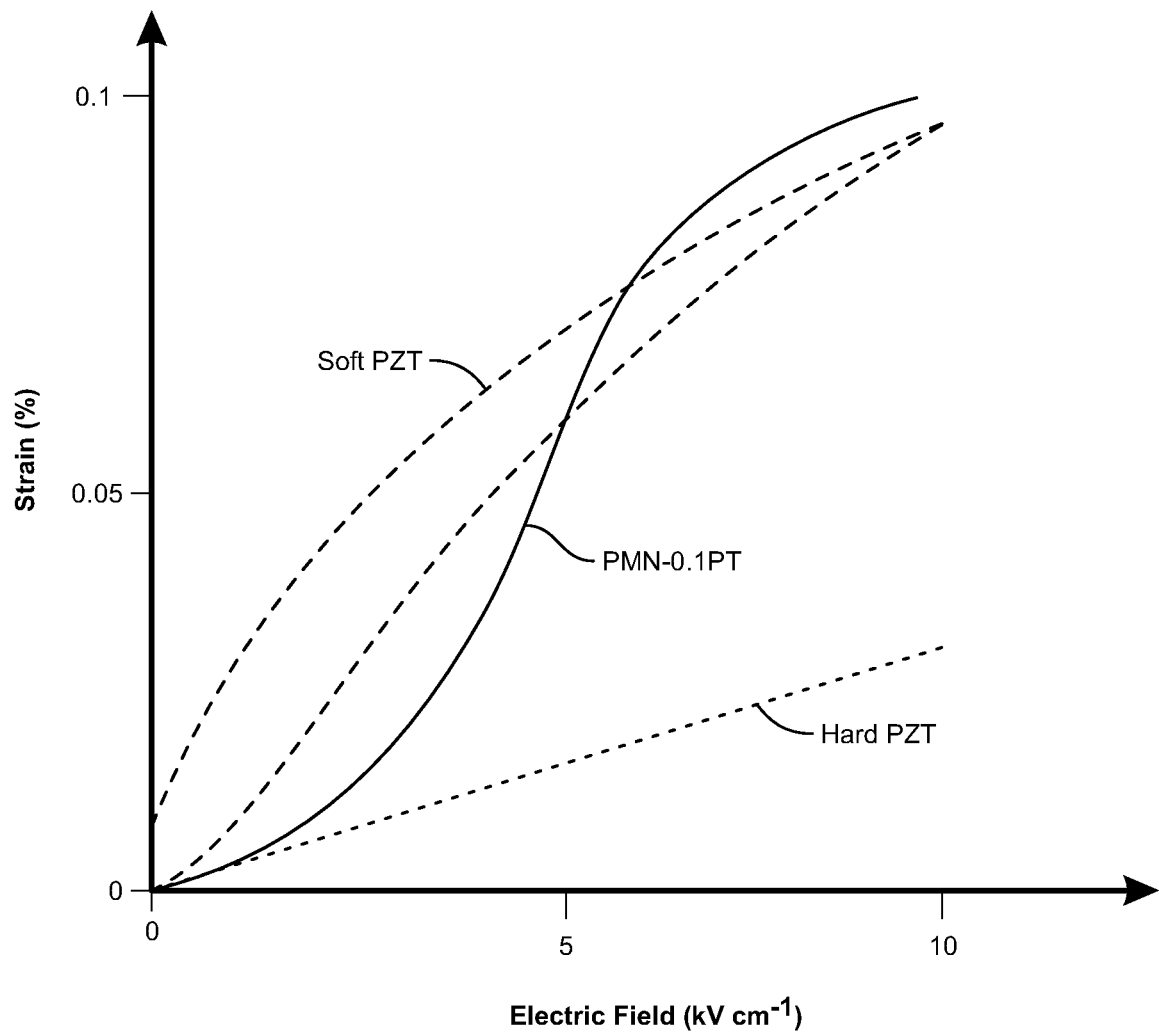
FIG. 6 is a plot of strain versus applied field showing the displacement characteristics for example electroactive ceramics according to some embodiments.
Figure 7:
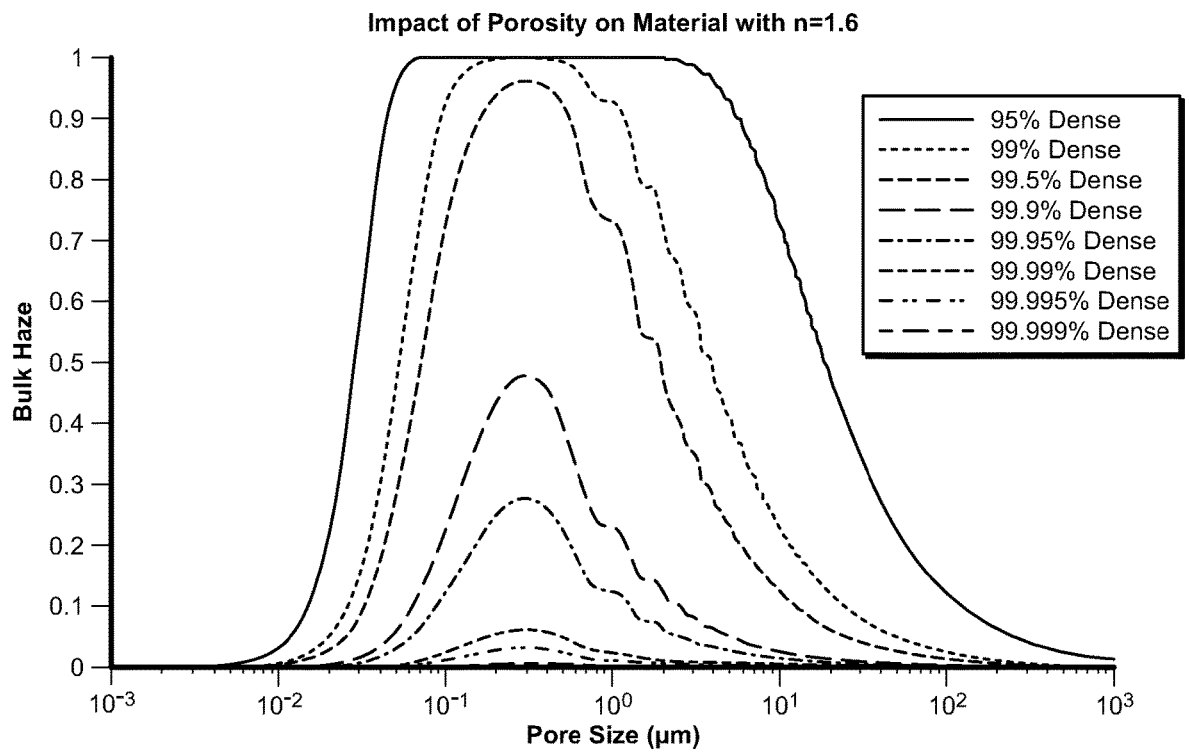
FIG. 7 is a plot of haze versus pore size for example electrostrictive ceramics having a refractive index of 1.6 when exposed to incident blue light according to some embodiments.
Figure 8:
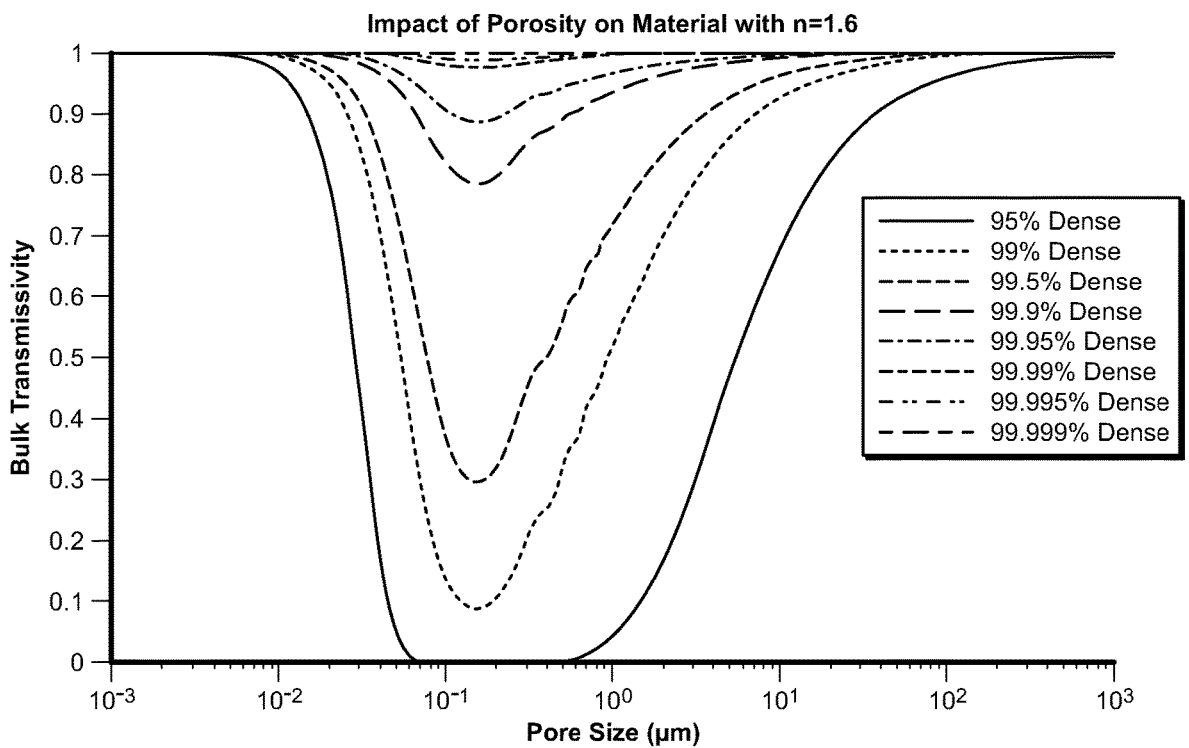
FIG. 8 is a plot showing the effect of pore size on the transmissivity of example electrostrictive ceramics having a refractive index of 1.6 when exposed to incident blue light according to some embodiments.
Figure 9:
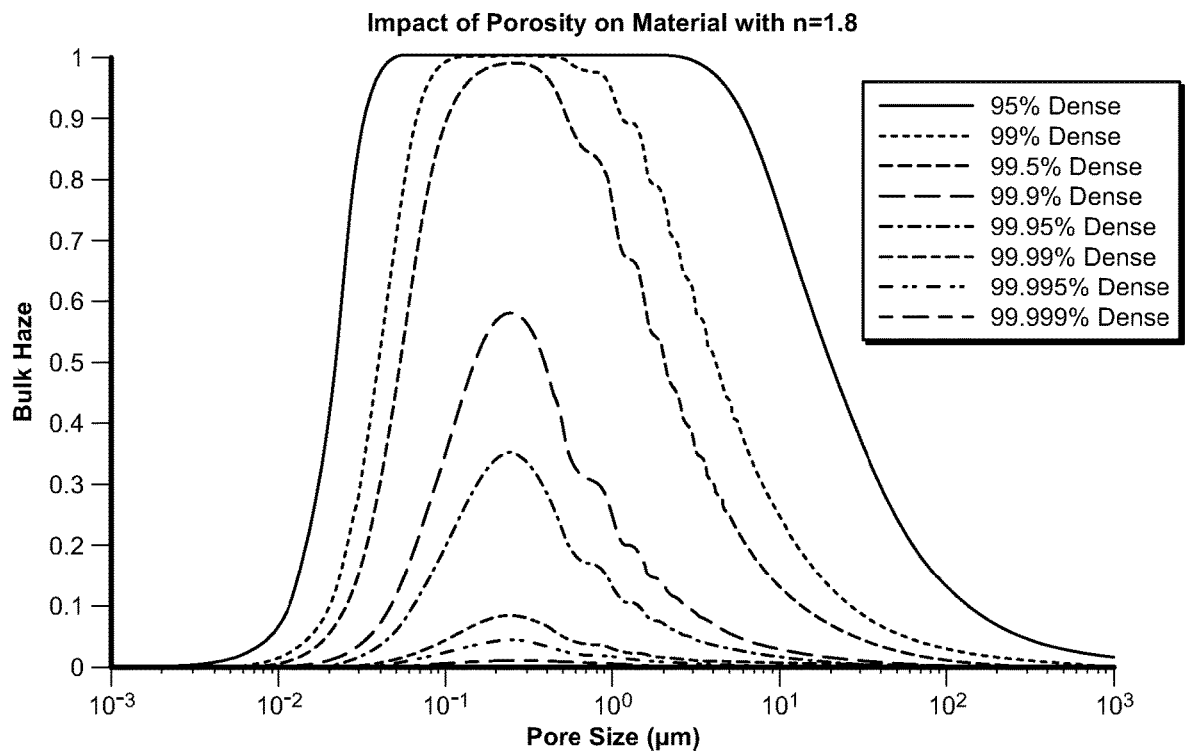
FIG. 9 is a plot of haze versus pore size for example electrostrictive ceramics having a refractive index of 1.8 when exposed to incident blue light according to some embodiments.
Figure 10:
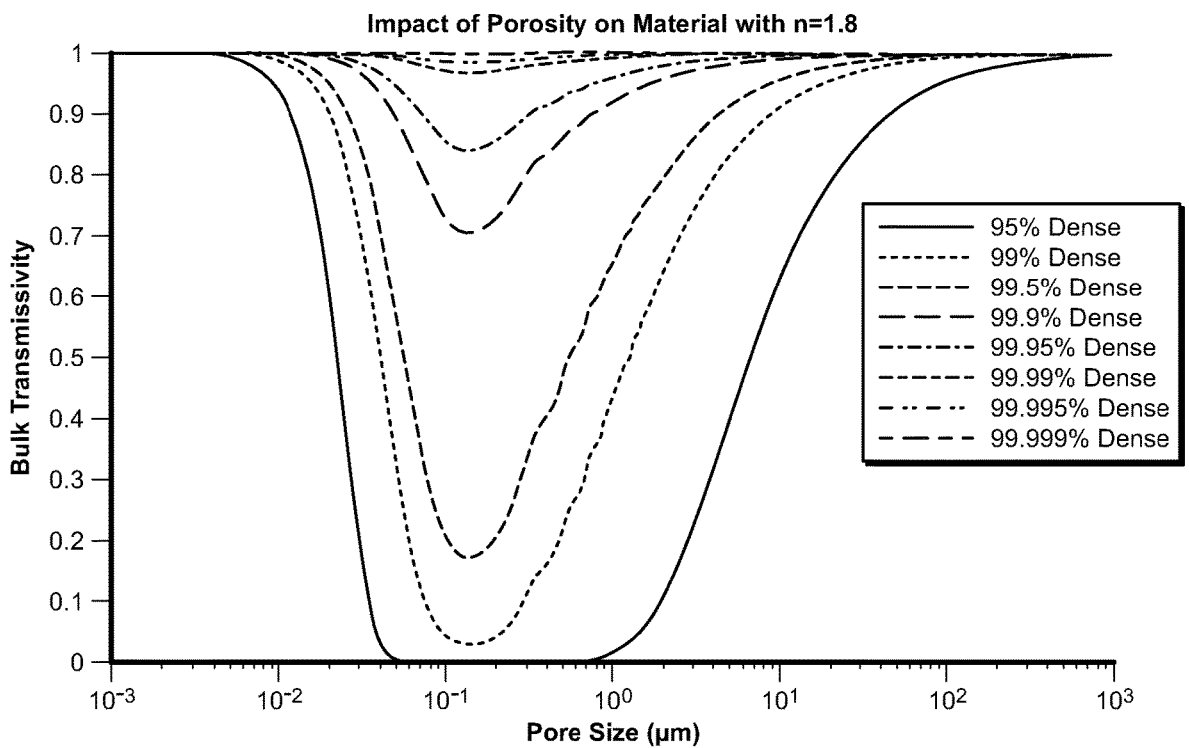
FIG. 10 is a plot showing the effect of pore size on the transmissivity of example electrostrictive ceramics having a refractive index of 1.8 when exposed to incident blue light according to some embodiments.
Figure 11:
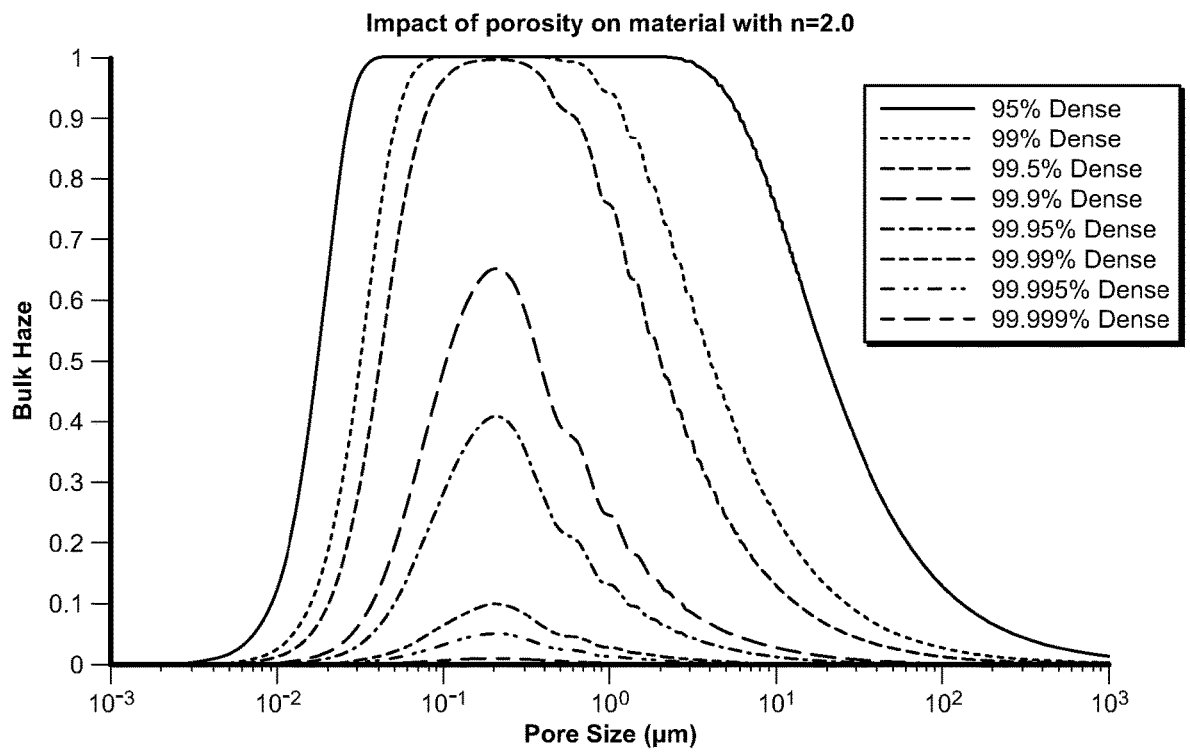
FIG. 11 is a plot showing the effect of pore size on bulk haze for example electrostrictive ceramics having a refractive index of 2.0 when exposed to incident blue light according to some embodiments.
Figure 12:
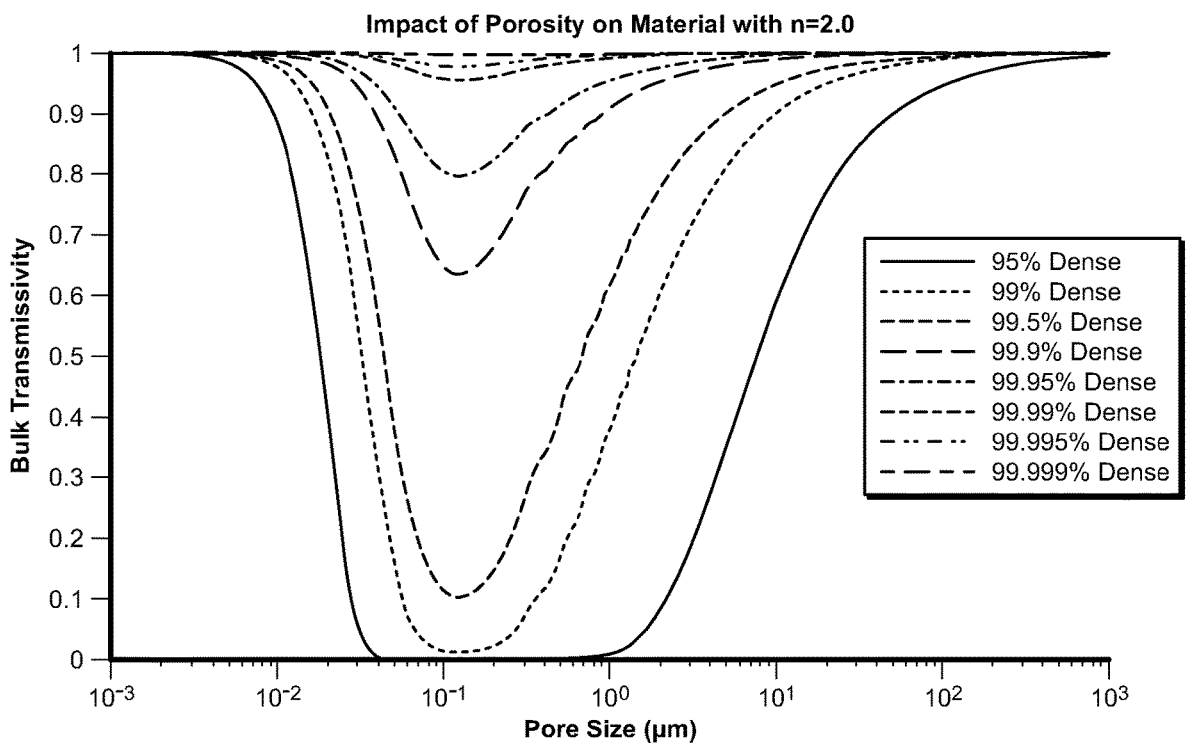
FIG. 12 is a plot of transmissivity versus pore size for example electrostrictive ceramics having a refractive index of 2.0 when exposed to incident blue light according to some embodiments.
Figure 13:
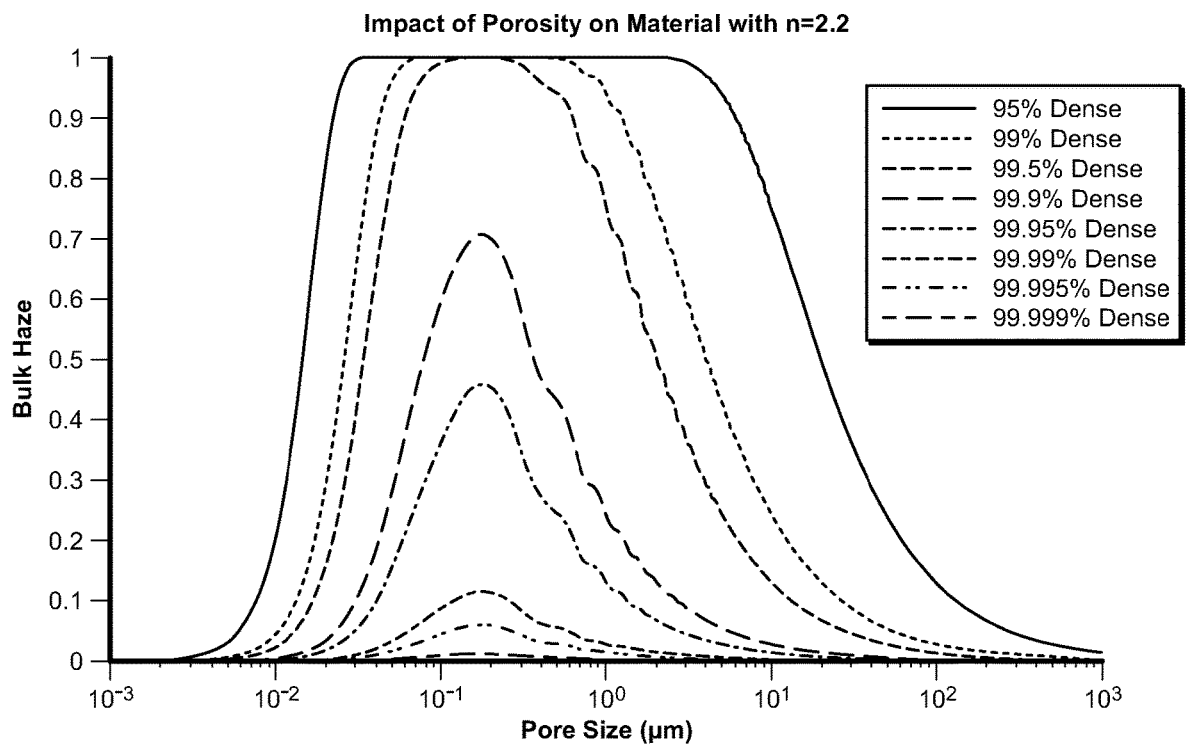
FIG. 13 is a plot of haze versus pore size for example electrostrictive ceramics having a refractive index of 2.2 when exposed to incident blue light according to some embodiments.
Figure 14:
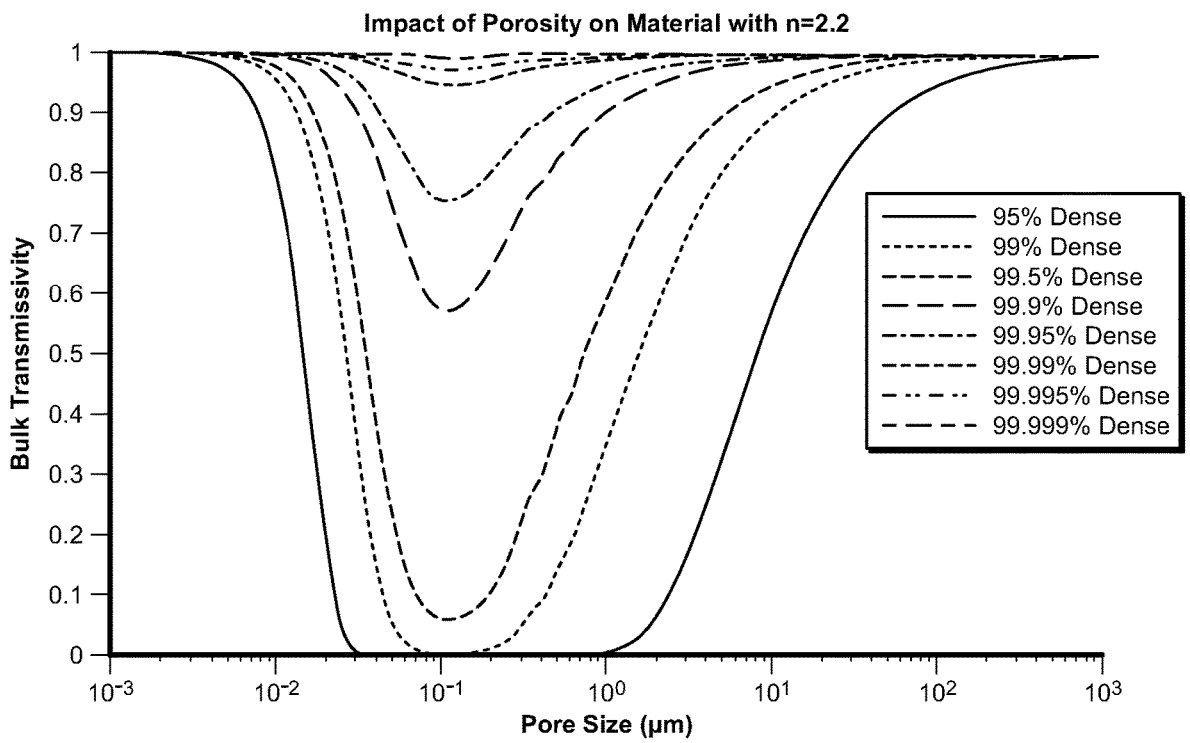
FIG. 14 is a plot showing the effect of pore size on the transmissivity of example electrostrictive ceramics having a refractive index of 2.2 when exposed to incident blue light according to some embodiments.
Figure 15:
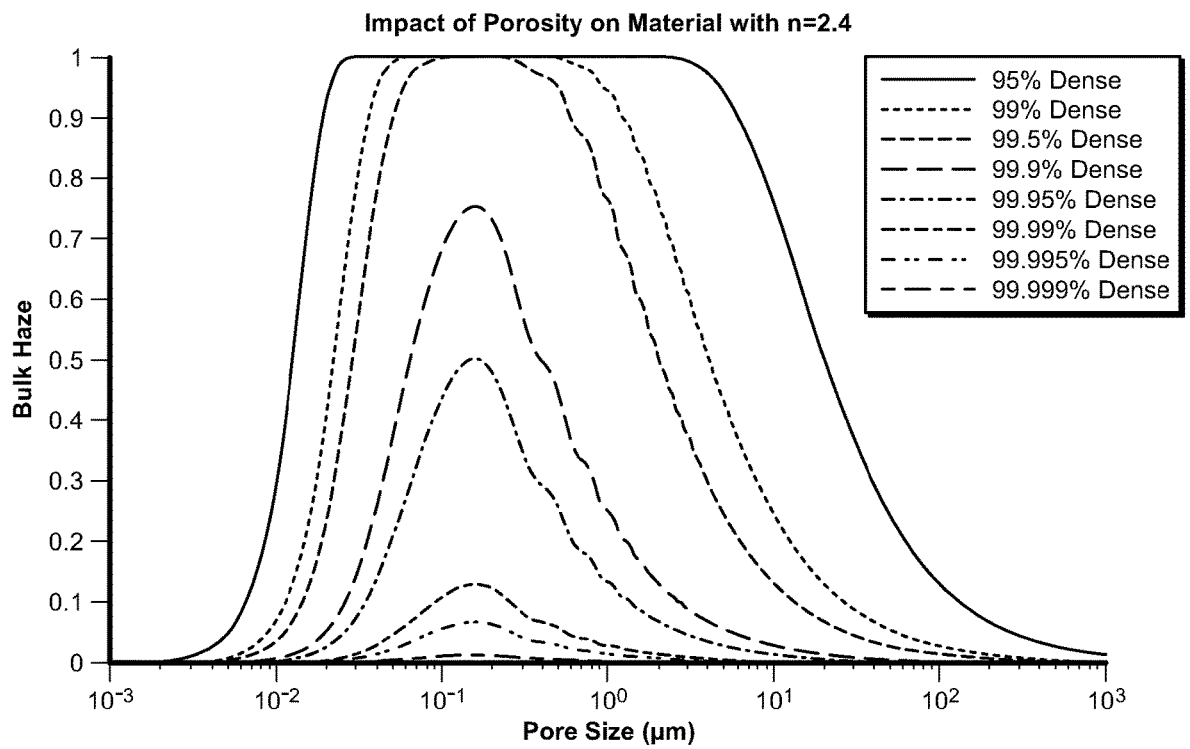
FIG. 15 is a plot showing the effect of pore size on bulk haze for example electrostrictive ceramics having a refractive index of 2.4 when exposed to incident blue light according to some embodiments.
Figure 16:
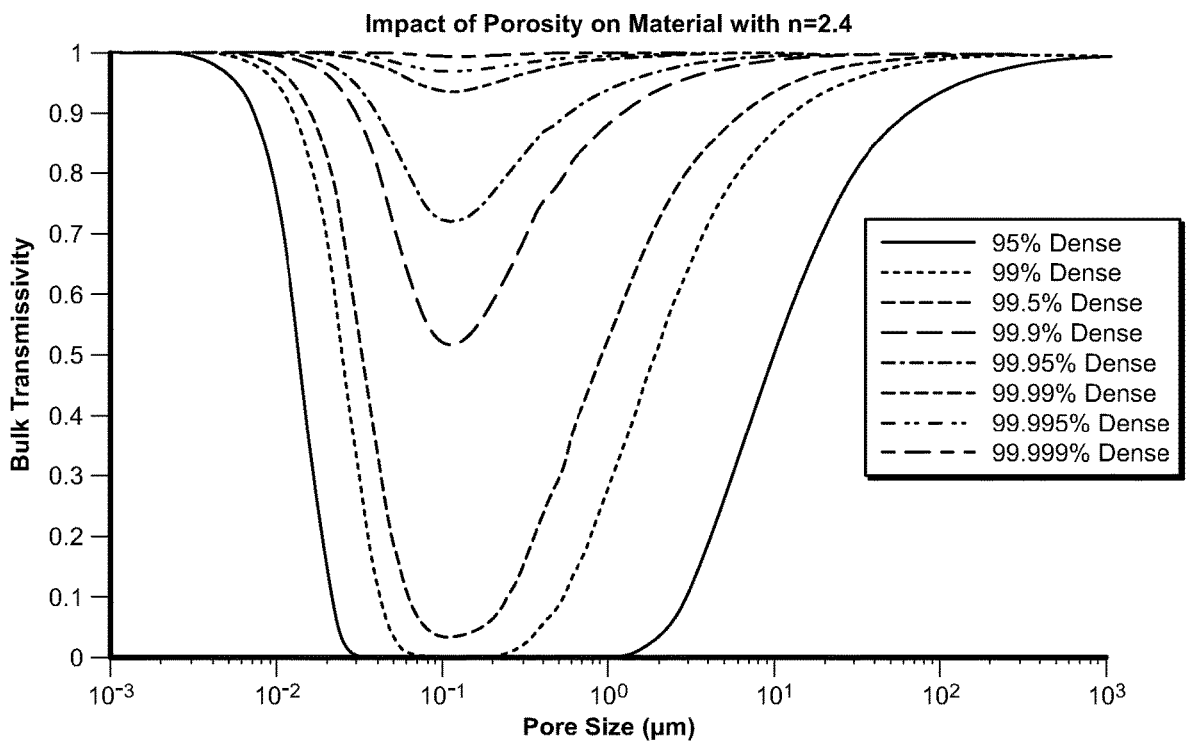
FIG. 16 is a plot of transmissivity versus pore size for example electrostrictive ceramics having a refractive index of 2.4 when exposed to incident blue light according to some embodiments.
Figure 17:
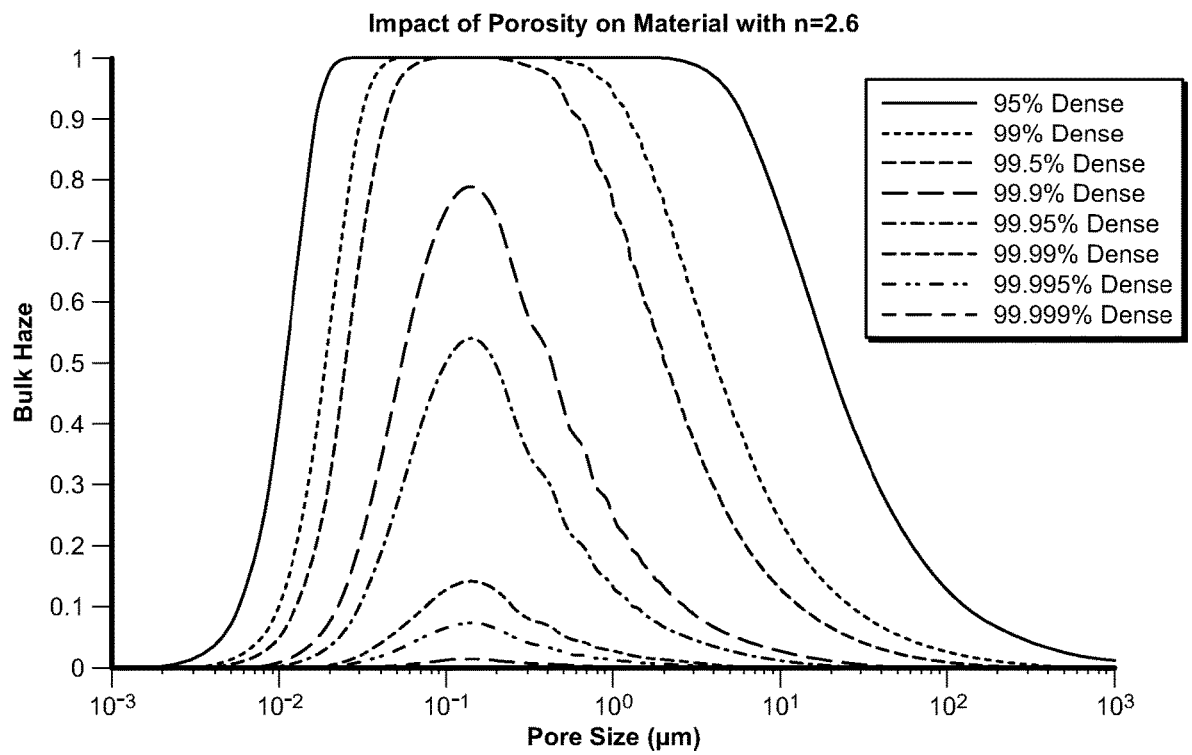
FIG. 17 is a plot showing the effect of pore size on bulk haze for example electrostrictive ceramics having a refractive index of 2.6 when exposed to incident blue light according to some embodiments.
Figure 18:
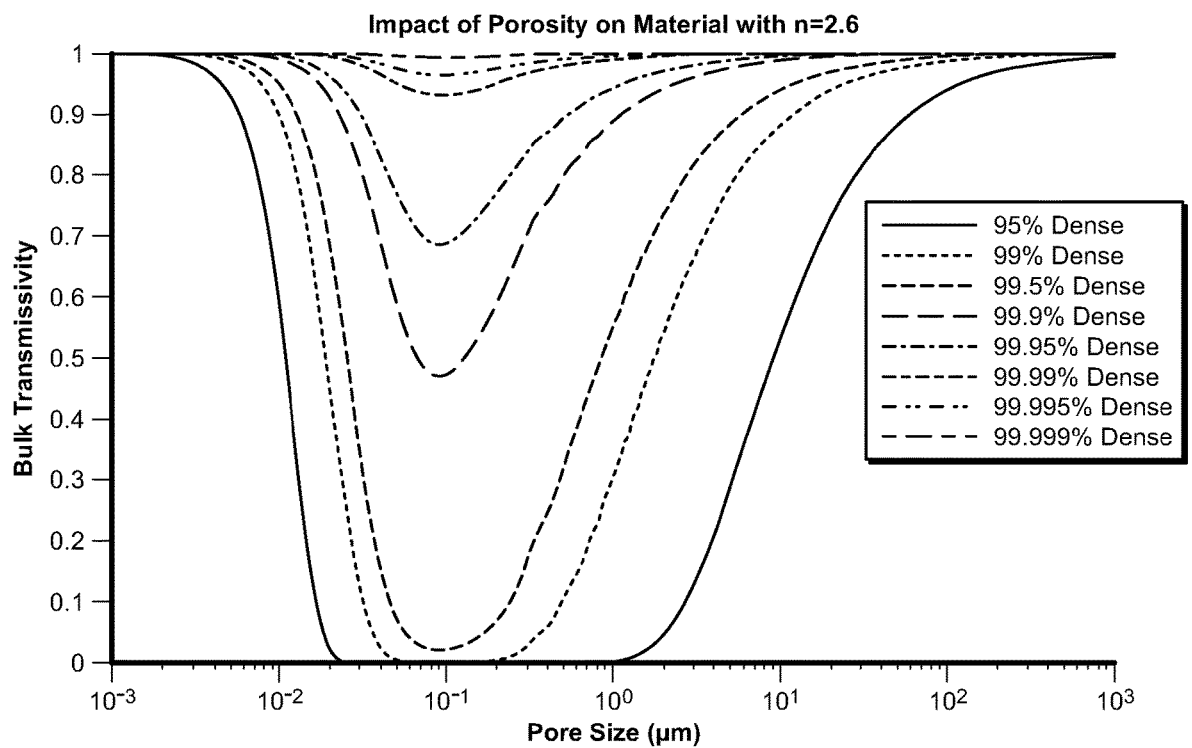
FIG. 18 is a plot of transmissivity versus pore size for example electrostrictive ceramics having a refractive index of 2.6 when exposed to incident blue light according to some embodiments.

Referring to FIG. 6, as noted herein, actuation of an optical element by applying a voltage to the primary electrode and/or the secondary electrode may induce a net deformation (strain) in at least one direction. FIG. 6 is a plot of strain versus applied field for an example PMN-0.1 PT electrostrictive ceramic. As will be appreciated, the electrostrictive ceramic may exhibit a total deformation that exceeds values commonly observed for hard PZT ferroelectrics while not exhibiting the degree of hysteresis commonly observed for soft PZT ferroelectrics. Larger displacements and less hysteresis may be desirable for various applications, including positioning and focusing systems, for example.

In some embodiments, an optical element may have a maximum thickness in an undeformed state and a compressed thickness in a deformed state. In some embodiments, an optical element may have a minimum thickness in an undeformed state and an expanded thickness in a deformed state. In some embodiments, an optical element may have a density in an undeformed state that is approximately 90% or less of a density of the optical element in the deformed state. In some embodiments, an optical element may exhibit a strain of at least approximately 0.02% when a voltage is applied between the primary electrode and the secondary electrode.

In some embodiments, an optical device may include one or more optical elements, and an optical element may include one or more electrostrictive layers. In various embodiments, an optical element may include a primary electrode, a secondary electrode overlapping at least a portion of the primary electrode, and an electrostrictive layer disposed between, i.e., in direct contact with at least a portion of, each of the primary electrode and the secondary electrode.

In some embodiments, the application of an electric field over an entirety of an electrostrictive layer may generate substantially uniform deformation between the primary and secondary electrodes. In some embodiments, the primary electrode and/or the secondary electrode may be patterned, allowing a localized electric field to be applied to a portion of the optical element, for example, to provide a localized deformation.

According to some embodiments, patterned electrodes (e.g., one or both of a primary electrode and a secondary electrode) may be used to actuate one or more regions within an intervening electrostrictive layer, i.e., to the exclusion of adjacent regions within the same electrostrictive layer.

In some embodiments, such patterned electrodes may be independently actuatable. Patterned electrodes may be formed by selective deposition of an electrode layer or by blanket deposition of an electrode layer followed by patterning and etching, e.g., using photolithographic techniques, as known to those skilled in the art. For instance, a patterned electrode may include a wire grid, or a wire grid may be incorporated into an optical element as a separate layer adjacent to an electrode layer. Discretely patterned electrodes may be individually addressable with distinct voltages, either simultaneously or sequentially.

An optical device may include a plurality of stacked elements. For example, each element may include an electrostrictive layer disposed between a pair of electrodes. In some embodiments, an electrode may be shared between elements; for example, a device may have alternating electrodes and an electrostrictive layer located between neighboring pairs of electrodes. Various stacked configurations can be constructed in different geometries that alter the shape, alignment, and spacing between elements. Such complex arrangements can enable compression, extension, twisting, and/or bending when operating such an actuator.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

The present disclosure is generally directed to electrostrictive ceramics and optical elements, e.g., actuators, that include electrostrictive ceramics. As will be explained in greater detail below, example electrostrictive ceramics may be characterized by a relative density of at least 99%, an average grain size of at least 300 nm, a transmissivity within the visible spectrum of at least approximately 70%, e.g., at least 70, 80, 90, 95, 97, 98, 99, or 99.5%, including ranges between any of the foregoing values, bulk haze of less than approximately 10%, e.g., 0.5, 1, 2, 4, 6, or 8%, including ranges between any of the foregoing values, optical clarity of at least approximately 70%, e.g., at least 70, 80, 90, 95, 97, 98, 99, or 99.5%, including ranges between any of the foregoing values, and reflectivity of less than approximately 30%, e.g. 1, 2, 5, 10, 20, or 25%, including ranges between any of the foregoing values. In particular embodiments, the optical properties of the disclosed electrostrictive ceramics, including transmissivity, haze, clarity, and reflectivity may be stable (i.e., substantially invariant) in response to an applied voltage.

By way of example, in response to an applied voltage, e.g., an applied voltage of up to approximately 2 MV/m, e.g., 0.5, 1, 1.5, or 2 MV/m, including ranges between any of the foregoing values, the electrostrictive ceramics disclosed herein may be characterized by one or more of a transmissivity within the visible spectrum of at least approximately 70%, e.g., at least 70, 80, 90, 95, 97, 98, 99, or 99.5%, including ranges between any of the foregoing values, bulk haze of less than approximately 10%, e.g., 0.5, 1, 2, 4, 6, or 8%, including ranges between any of the foregoing values, optical clarity of at least approximately 70%, e.g., at least 70, 80, 90, 95, 97, 98, 99, or 99.5%, including ranges between any of the foregoing values, and reflectivity of less than approximately 30%, e.g. 1, 2, 5, 10, 20 or 25%, including ranges between any of the foregoing values.

According to further embodiments, in response to an applied voltage, e.g., an applied voltage of up to approximately 2 MV/m, e.g., 0.5, 1, 1.5, or 2 MV/m, including ranges between any of the foregoing values, the electrostrictive ceramics may exhibit a change in transmissivity of less than approximately 50%, e.g., 5%, 10%, 15%, 20%, 25%, 30%, 35%, 40%, or 45%, including ranges between any of the foregoing values; a change in haze of less than approximately 50%, e.g., 5%, 10%, 15%, 20%, 25%, 30%, 35%, 40%, or 45%, including ranges between any of the foregoing values; a change in clarity of less than approximately 50%, e.g., 5%, 10%, 15%, 20%, 25%, 30%, 35%, 40%, or 45%, including ranges between any of the foregoing values; and/or a change in reflectivity of less than approximately 50%, e.g., 5%, 10%, 15%, 20%, 25%, 30%, 35%, 40%, or 45%, including ranges between any of the foregoing values.

Features from any of the embodiments described herein may be used in combination with one another in accordance with the general principles described herein. These and other embodiments, features, and advantages will be more fully understood upon reading the following detailed description in conjunction with the accompanying drawings and claims.

The present disclosure will provide, with reference to FIGS. 1-25, detailed descriptions of methods, systems and apparatus for forming optical elements that include a layer of a transparent and voltage-stable electrostrictive ceramic. The discussion associated with FIGS. 1-4 includes a description of example electrostrictive materials. The discussion associated with FIG. 5 includes a description of an optical element including a layer of an electrostrictive material according to some embodiments. The discussion associated with FIG. 6 includes a description of the voltage-induced deformation of example actuators. The discussion associated with FIGS. 7-22 includes a description of modeled optical properties for example electrostrictive ceramic materials. The discussion associated with FIGS. 23-25 relates to exemplary virtual reality and augmented reality device architectures that may include an optical element including a transparent electrostrictive ceramic layer.

In various approaches, the optical transmissivity of electrostrictive materials may be improved through microstructural engineering and the elimination of porosity. For many electroactive materials, the application of an electric field, especially greater than approximately 0.5 MV/m, has been observed to significantly decrease transmissivity as domains grow and coalesce or as the material undergoes distortion under an applied E-field, which may render it more highly birefringent. Further to the foregoing, Applicants have shown that dense, electrostrictive compositions may exhibit voltage stable optical properties while providing a commercially relevant displacement.

By way of example, for 100 micrometer thick electrostrictive layers having relative densities ranging from approximately 95% to approximately 99.999% and exposed to incident light having a wavelength of 400 nm, bulk optical properties (e.g., haze and transmissivity) are plotted as a function of pore size in FIGS. 7-18 for modeled refractive index values ranging from 1.6 to 2.6. In accordance with various embodiments, a transmissivity greater than approximately 90% and bulk haze less than 10% may be achieved in various electrostrictive materials having a relative density greater than approximately 99.995% and/or an average pore size of less than approximately 50 nm.

Figure 19:
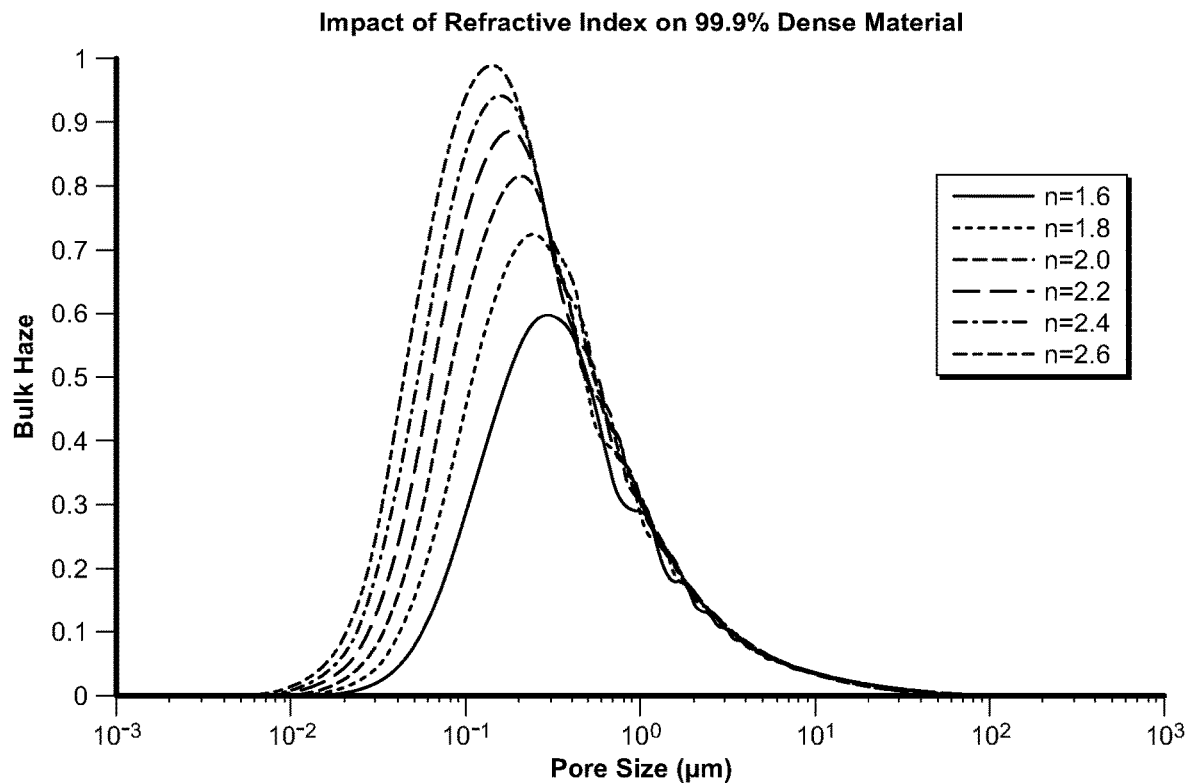
FIG. 19 is a plot showing the effect of pore size on bulk haze for nearly fully-dense electrostrictive ceramics when exposed to incident blue light according to some embodiments.
Figure 20:
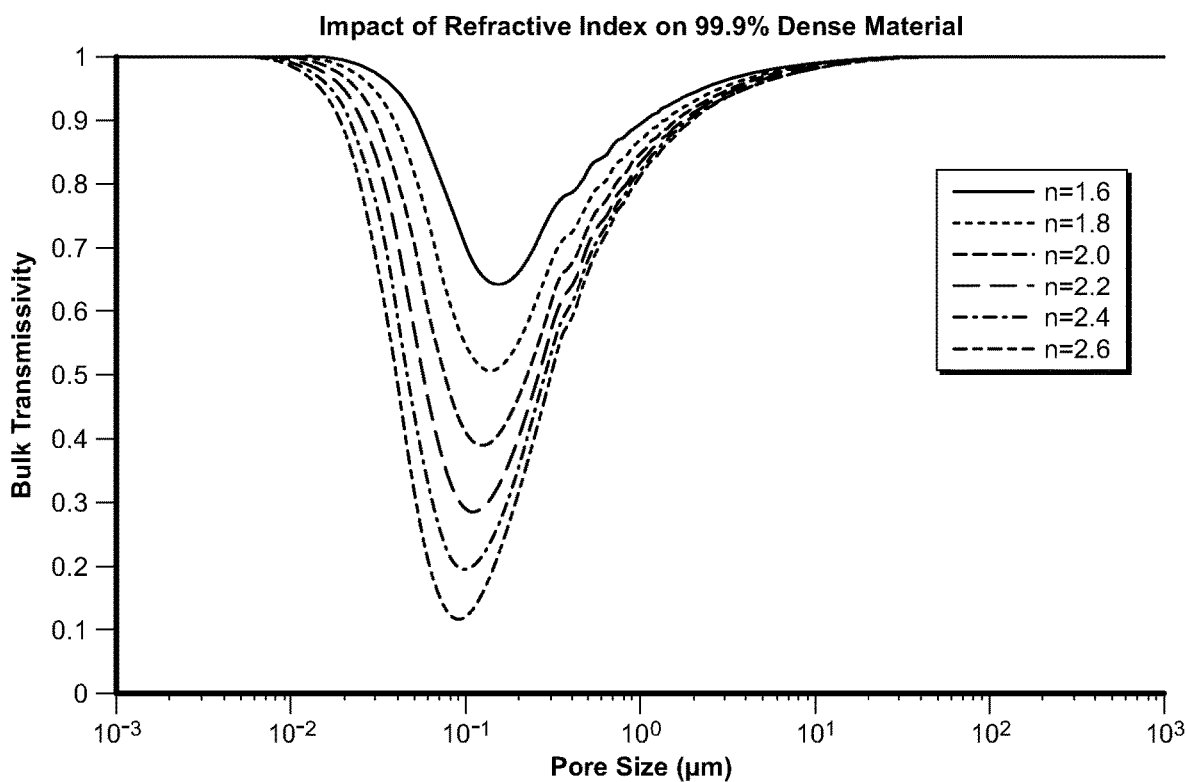
FIG. 20 is a plot of transmissivity versus pore size for nearly fully-dense electrostrictive ceramics when exposed to incident blue light according to some embodiments.
Figure 21:
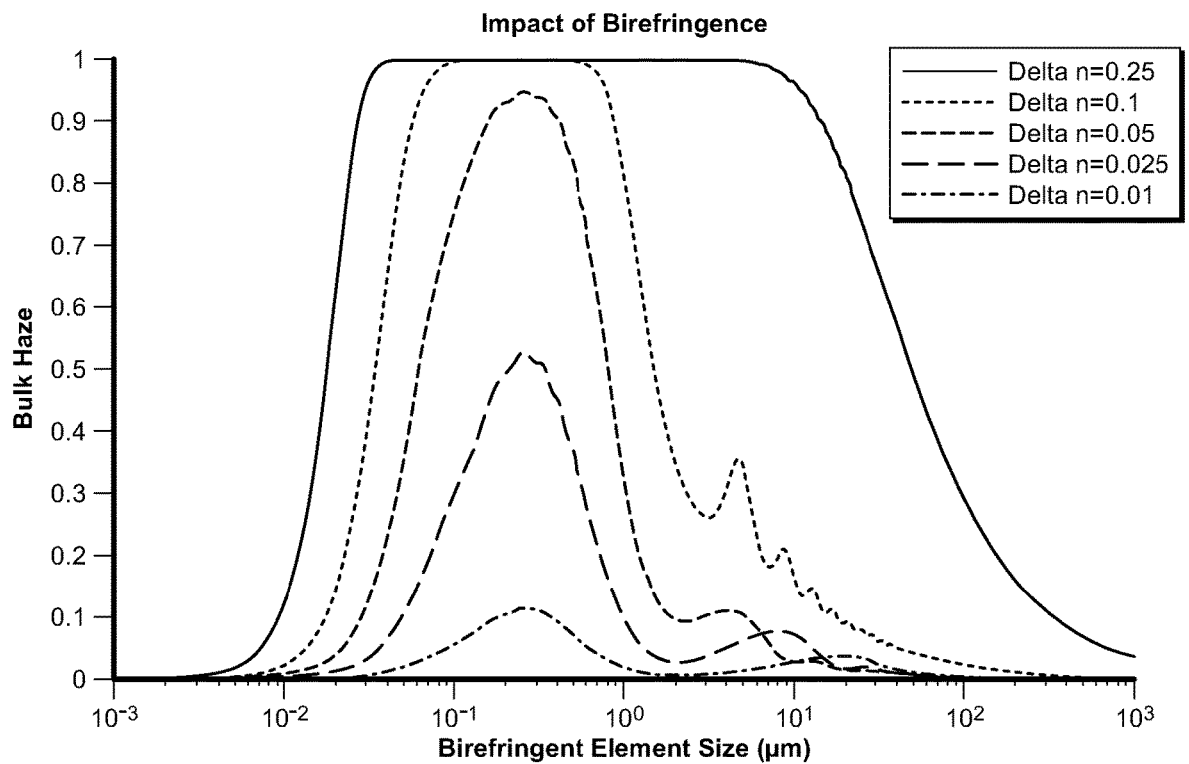
FIG. 21 is a plot showing the effect of birefringent scattering on bulk haze for example electrostrictive ceramics when exposed to incident blue light according to some embodiments.
Figure 22:
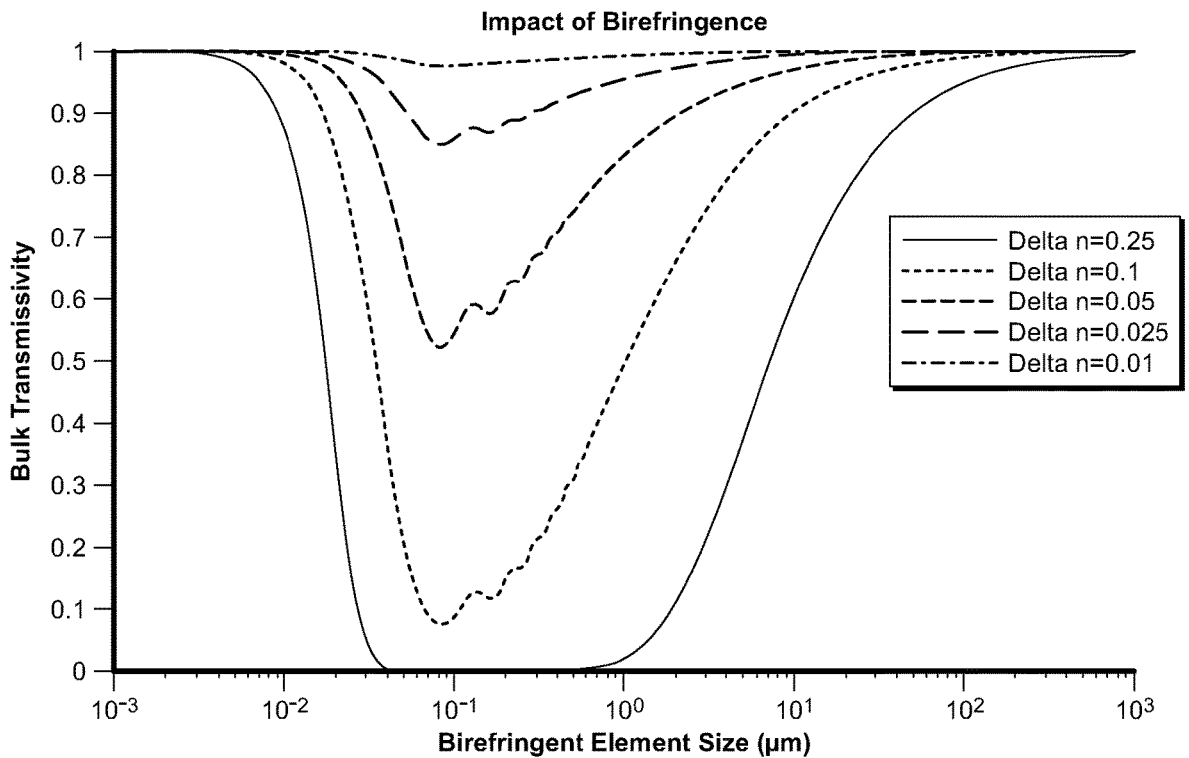
FIG. 22 is a plot of transmissivity versus birefringent scattering feature size for example electrostrictive ceramics when exposed to incident blue light according to some embodiments.

With reference to FIG. 19 and FIG. 20, it will be appreciated that the impact of porosity may be less for electrostrictive layers having a comparatively lower refractive index. Furthermore, the impact of birefringent scattering for a 100 micrometer thick electrostrictive layer (n=2.6) illuminated with 400 nm light is shown in FIG. 21 and FIG. 22. As will be appreciated, the data in FIGS. 7-22 can be used to engineer electrostrictive layers exhibiting desired amounts of transmissivity and/or haze.

Example methods of forming dense, optically transparent electrostrictive ceramics may include forming ceramic powders, mixing, calcination, milling, green body formation, and high temperature sintering.

High-purity raw materials for the electrostrictive ceramic composition may include PbO, $Pb_3O_4$, $ZrO_2$, $TiO_2$, MgO, $Mg(OH)_2MgCO_3$, $MnO_2$, $Nb_2O_5$, and $La_2O$, as well as respective hydrates thereof. In some embodiments, the raw materials may be at least approximately 99.9% pure, e.g., 99.9%, 99.95%, or 99.99% pure, including ranges between any of the foregoing values.

Precursor powders of suitable reactant compositions may be prepared by flame spray pyrolysis, for example, whereby an aerosol of an appropriate metal salt, chelate, coordination compound, etc., may be sprayed into a furnace and heated to a temperature sufficient to evaporate the solvent and form nanoscale particles. Precursor powders may also be synthesized by hydrothermal processes, sol-gel processes, or solvothermal processes, as known to those skilled in the art.

Before or after mixing, precursor powders may be milled to produce a desired particle size. Example milling processes include ball milling, e.g., planetary ball milling, and attrition milling, although other milling processes are contemplated. During milling, the particles may be dry or mixed with a liquid such as ethanol. Example precursor powders, i.e., prior to sintering, may have an average particle size of less than approximately 500 nm, e.g., less than approximately 500 nm, less than approximately 400 nm, less than approximately 300 nm, less than approximately 250 nm, less than approximately 200 nm, less than approximately 150 nm, less than approximately 100 nm, less than approximately 50 nm, or less than approximately 25 nm, including ranges between any of the foregoing values, although precursor powders having a larger average particle size may be used.

In some embodiments, the milled powders may be calcined for a period of approximately 1 hr to approximately 24 hr, e.g., 1, 2, 4, 10, 15, 20 or 24 hr, at a temperature ranging from approximately 300° C. to approximately 1000° C., e.g., 300° C., 400° C., 500° C., 600° C., 700° C., 800° C., 900° C., or 1000° C., including ranges between any of the foregoing values. Calcination may be performed in an oxidizing environment, for example, and may be used to remove unwanted impurities, including organic impurities such as carbon.

According to various embodiments, a powder mixture may be compacted into a pellet or dispersed in a liquid and cast into a thin film, e.g., via extrusion or doctor blading, to produce a desired form factor. For instance, a powder mixture may be compacted by applying a uniaxial or hydrostatic pressure of approximately 10 MPa to approximately 500 MPa, e.g., 10, 15, 20, 25, 30, 50, 100, 200, 300, 400, or 500 MPa, including ranges between any of the foregoing values.

The shaped bodies may be sintered. In some embodiments, the sintering temperature may range from approximately 750° C. to approximately 1400° C., e.g., 750° C., 800° C., 900° C., 1000° C., 1100° C., 1200° C., 1300° C., or 1400° C., including ranges between any of the foregoing values. In certain embodiments, the powders may be sintered in a controlled atmosphere, such as an oxidizing atmosphere, a reducing atmosphere, or under vacuum. In certain embodiments, pressure, e.g., uniaxial pressure, may be applied during sintering. Example sintering processes include conventional sintering, spark plasma sintering, flash sintering, or sintering using microwaves.

According to some embodiments, the sintered ceramic may be heated, e.g., under oxidizing or reducing conditions, to adjust the oxygen stoichiometry. Such a post-sintering anneal may be performed under vacuum or at approximately atmospheric pressure. In some embodiments, during a post-sinter heating step, the ceramic may be annealed within a bed of the precursor powder mixture, which may inhibit the evaporation of lead. In various embodiments, the densified ceramic may be ground, lapped and/or polished to achieve a smooth surface. In example embodiments, a transparent electrostrictive ceramic may have an average grain size of at least approximately 300 nm and a surface roughness of less than approximately 50 nm.

In an example method, magnesium oxide and niobium oxide powders may be ball milled in ethanol and calcined at 300° C.-1000° C. for 1 to 24 hr. To inhibit the formation of non-perovskite phases, lead oxide and titanium oxide powders may be added following the foregoing calcination step, and the mixture may then be ball milled in ethanol and calcined at 500° C.-1200° C. for 0.5 to 12 hr. Following the second calcination step, the powder mixture may be milled, compacted under a uniaxial pressure of 10-500 MPa and, while maintaining the applied pressure, sintered by spark plasma sintering at 750° C.-1150° C. In some embodiments, the sintered ceramic may be heated to 400° C.-1400° C. for 2-24 hr in an oxidizing environment. Following sintering, the lead zirconium magnesium titanate ceramic composition may have a relative density greater than approximately 99% and an average grain size of at least approximately 200 nm.

In a further method, powders of lead oxide, zirconium oxide, and titanium oxide may be combined in an appropriate ratio and milled to form a powder mixture having an average particle size of less than 500 nm. The powder mixture may be heated (calcined) at approximately 300° C.-700° C. to remove excess carbon. The calcined powder may be sintered to form a dense, transparent ceramic having an average grain size of at least approximately 300 nm.

In some embodiments, a ceramic powder may be derived from a solution of one or more salts, chelates, and/or coordination complexes of, for example, lead, zirconium, and titanium, although further or alternate metal compounds may be used. The solution may be distilled, evaporated, and dried to form a compositionally homogeneous powder. The powder mixture may be milled to an average particle size of less than approximately 300 nm, calcined to remove residual carbon, compacted, and sintered to form a dense, transparent ceramic having an average grain size of at least approximately 300 nm, a relative density of at least 99%, transmissivity within the visible spectrum of at least 70%, and bulk haze of less than approximately 10%.

As disclosed herein, an optically transparent actuator may include a pair of electrodes and a layer of an electrostrictive ceramic disposed between the electrodes. Methods of manufacturing the ceramic layer achieve a dense, nanocrystalline structure having a robust suite of optical properties. That is, the haze, transmissivity, reflectivity, and clarity characteristics of the ceramic present a high optical quality layer without exhibiting appreciable degradation in any of the foregoing characteristics under an applied electric field. For instance, an example electrostrictive ceramic layer may maintain less than 10% haze, greater than 70% transmissivity, less than 30% reflectivity, and at least 70% optical clarity under applied fields of up to 2 MV/m. In particular embodiments, optical scattering, which may be a significant detractor to optical transparency, may be controlled during manufacturing by engineering a microstructure that is at least 99.5% dense with a grain size of at least 300 nm. Such electrostrictive ceramics may be manufactured using powder processing, including powder modification (e.g. milling to achieve a sub-micron particle size), calcination, green body formation, and high temperature sintering. Example ceramics may include lead magnesium niobate, as well as other compositions that may have a macroscopic cubic or pseudocubic symmetry.

EXAMPLE EMBODIMENTS

Example 1: An optical element includes a primary electrode, a secondary electrode overlapping at least a portion of the primary electrode, and an electrostrictive layer disposed between and abutting the primary electrode and the secondary electrode, where the electrostrictive layer may be characterized by (a) a relative density of at least approximately 99%, (b) an average grain size of at least approximately 300 nm, (c) a transmissivity within the visible spectrum of at least approximately 70%, and (d) bulk haze of less than approximately 10%.

Example 2: The optical element of Example 1, where the electrostrictive layer may be further characterized by an optical clarity of at least approximately 70%.

Example 3: The optical element of any of Examples 1 and 2, where the electrostrictive layer may be further characterized by an optical reflectivity of less than approximately 30%.

Example 4: The optical element of any of Examples 1-3, when exposed to a non-zero electric field of up to 2 MV/m, may be characterized by at least one of (a) less than a 50% change in the transmissivity, (b) a change in the bulk haze of less than 50%, and (c) a change in clarity of less than 50%.

Example 5: The optical element of any of Examples 1-4, where the electrostrictive layer exhibits less than a 50% change in each of transparency, bulk haze, and clarity when a voltage is applied to the primary electrode.

Example 6: The optical element of any of Examples 1-5, where the electrostrictive layer includes at least one compound selected from barium titanium zirconium oxide, barium titanium tin oxide, barium strontium titanium oxide, barium zirconium oxide, lead magnesium titanium oxide, lead magnesium niobium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, and bismuth zinc tantalum oxide.

Example 7: The optical element of Example 6, where the electrostrictive layer further includes one or more of strontium titanium oxide, calcium titanium oxide, lead titanium oxide, lead zirconium titanium oxide, barium titanium oxide, bismuth iron oxide, sodium bismuth titanium oxide, bismuth scandium oxide, bismuth titanium oxide, lithium tantalum oxide, sodium potassium niobium oxide, and lithium niobium oxide.

Example 8: The optical element of any of Examples 1-7, where the electrostrictive layer further includes at least one dopant selected from niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

Example 9: The optical element of any of Examples 1-8, where the electrostrictive layer may be characterized by an RMS surface roughness of less than approximately 50 nm.

Example 10: The optical element of any of Examples 1-9, where the electrostrictive layer includes a cubic phase.

Example 11: The optical element of any of Examples 1-10, where the electrostrictive layer includes a polar nanoregion.

Example 12: A head-mounted display including the optical element of any of Examples 1-11.

Example 13: An optical element includes a transparent primary electrode, a transparent secondary electrode overlapping at least a portion of the transparent primary electrode, and an electrostrictive ceramic layer disposed between and abutting the transparent primary electrode and the transparent secondary electrode, where the electrostrictive layer may be characterized by (a) a transmissivity within the visible spectrum of at least approximately 70%, (b) bulk haze of less than approximately 10%, (c) optical clarity of at least approximately 70%; and (d) optical reflectivity of less than approximately 30%.

Example 14: The optical element of Example 13, where the electrostrictive layer may be further characterized by a relative density of at least approximately 99.5% and an average grain size of at least approximately 300 nm.

Example 15: The optical element of any of Examples 13 and 14, where the electrostrictive ceramic layer includes a relative density of at least approximately 99.995%, an average pore size of less than approximately 50 nm, and a transmissivity within the visible spectrum of at least approximately 90%.

Example 16: A method includes forming a powder mixture and sintering the powder mixture to form an electrostrictive ceramic, where the electrostrictive ceramic may be characterized by (a) a relative density of at least approximately 99.5%, (b) a transmissivity within the visible spectrum of at least approximately 70%, and (c) bulk haze of less than approximately 10%.

Example 17: The method of Example 16, where forming the powder mixture includes forming a partial powder mixture, wherein the partial powder mixture is lead free, calcining the partial powder mixture, and adding lead oxide to the calcined partial powder mixture to form the powder mixture.

Example 18: The method of any of Examples 16 and 17, where the electrostrictive ceramic may be characterized by an average grain size of at least approximately 300 nm.

Example 19: The method of any of Examples 16-18, further including forming a transparent electrode over the electrostrictive ceramic.

Example 20: The method of any of Examples 16-19, further including forming a transparent electrode over opposing surface of the electrostrictive ceramic.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 2300 in FIG. 23. Other artificial reality systems may include a NED that also provides visibility into the real world (e.g., augmented-reality system 2400 in FIG. 24) or that visually immerses a user in an artificial reality (e.g., virtual-reality system 2500 in FIG. 25). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 23:
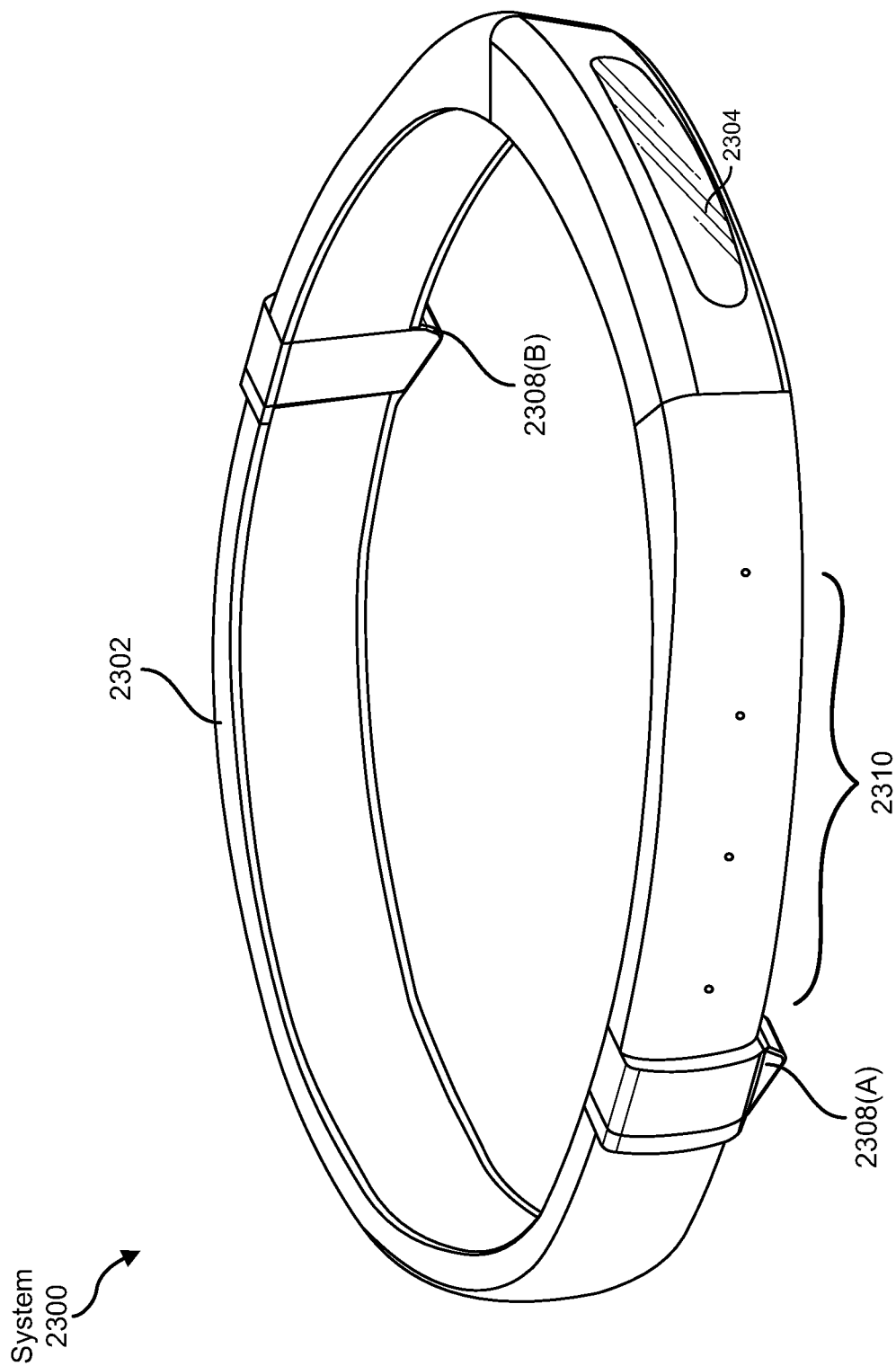
FIG. 23 is an illustration of an exemplary artificial-reality headband that may be used in connection with embodiments of this disclosure.

Turning to FIG. 23, augmented-reality system 2300 generally represents a wearable device dimensioned to fit about a body part (e.g., a head) of a user. As shown in FIG. 23, system 2300 may include a frame 2302 and a camera assembly 2304 that is coupled to frame 2302 and configured to gather information about a local environment by observing the local environment. Augmented-reality system 2300 may also include one or more audio devices, such as output audio transducers 2308(A) and 2308(B) and input audio transducers 2310. Output audio transducers 2308(A) and 2308(B) may provide audio feedback and/or content to a user, and input audio transducers 2310 may capture audio in a user's environment.

As shown, augmented-reality system 2300 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2300 may not include a NED, augmented-reality system 2300 may include other types of screens or visual feedback devices (e.g., a display screen integrated into a side of frame 2302).

Figure 24:
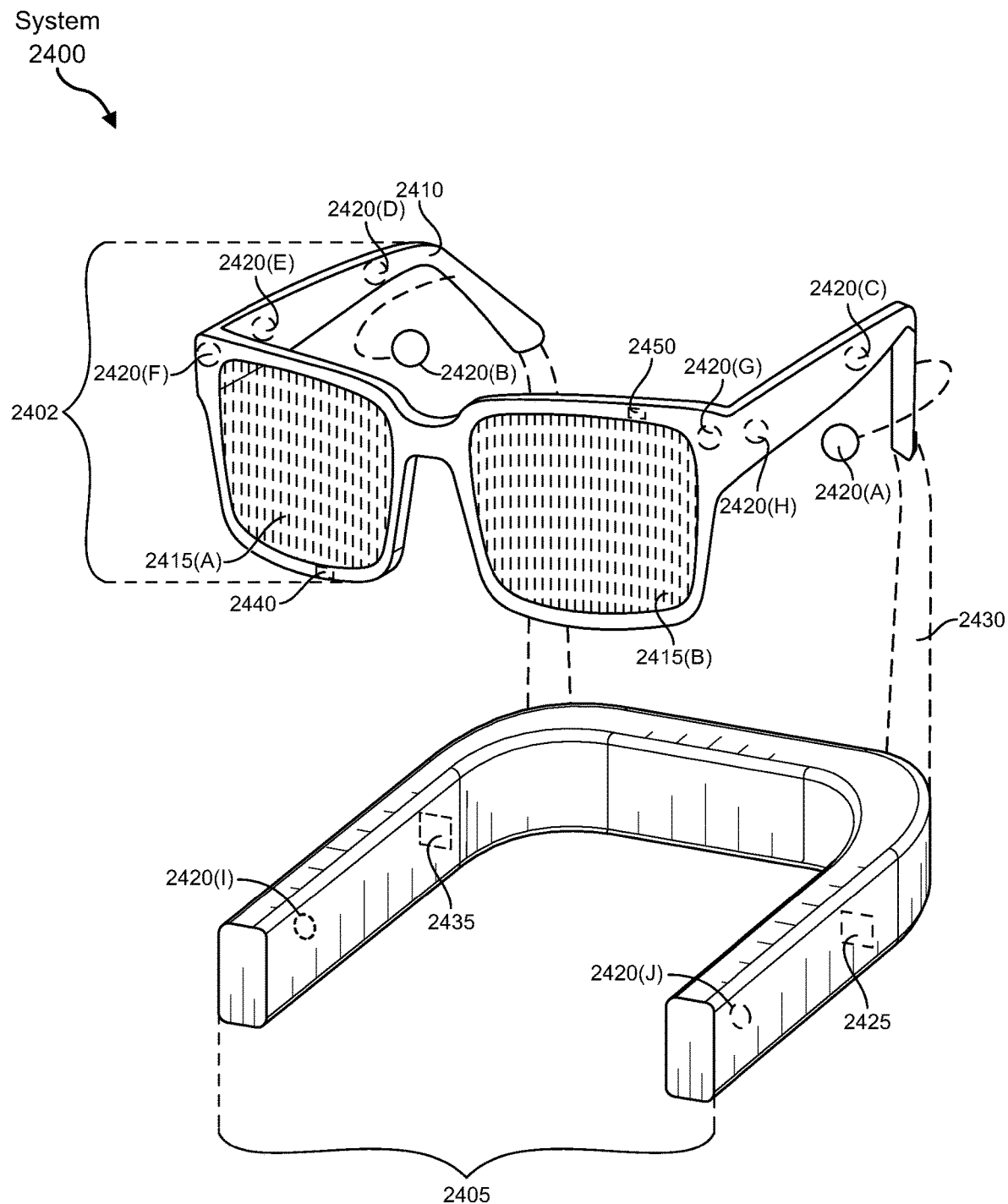
FIG. 24 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 24, augmented-reality system 2400 may include an eyewear device 2402 with a frame 2410 configured to hold a left display device 2415(A) and a right display device 2415(B) in front of a user's eyes. Display devices 2415(A) and 2415(B) may act together or independently to present an image or series of images to a user. While augmented-reality system 2400 includes two displays, embodiments of this disclosure may be implemented in augmented-reality systems with a single NED or more than two NEDs.

In some embodiments, augmented-reality system 2400 may include one or more sensors, such as sensor 2440. Sensor 2440 may generate measurement signals in response to motion of augmented-reality system 2400 and may be located on substantially any portion of frame 2410. Sensor 2440 may represent a position sensor, an inertial measurement unit (IMU), a depth camera assembly, or any combination thereof. In some embodiments, augmented-reality system 2400 may or may not include sensor 2440 or may include more than one sensor. In embodiments in which sensor 2440 includes an IMU, the IMU may generate calibration data based on measurement signals from sensor 2440. Examples of sensor 2440 may include, without limitation, accelerometers, gyroscopes, magnetometers, other suitable types of sensors that detect motion, sensors used for error correction of the IMU, or some combination thereof.

Augmented-reality system 2400 may also include a microphone array with a plurality of acoustic transducers 2420(A)-2420(J), referred to collectively as acoustic transducers 2420. Acoustic transducers 2420 may be transducers that detect air pressure variations induced by sound waves. Each acoustic transducer 2420 may be configured to detect sound and convert the detected sound into an electronic format (e.g., an analog or digital format). The microphone array in FIG. 24 may include, for example, ten acoustic transducers: 2420(A) and 2420(B), which may be designed to be placed inside a corresponding ear of the user, acoustic transducers 2420(C), 2420(D), 2420(E), 2420(F), 2420(G), and 2420(H), which may be positioned at various locations on frame 2410, and/or acoustic transducers 2420(I) and 2420(J), which may be positioned on a corresponding neckband 2405.

In some embodiments, one or more of acoustic transducers 2420(A)-(F) may be used as output transducers (e.g., speakers). For example, acoustic transducers 2420(A) and/or 2420(B) may be earbuds or any other suitable type of headphone or speaker.

The configuration of acoustic transducers 2420 of the microphone array may vary. While augmented-reality system 2400 is shown in FIG. 24 as having ten acoustic transducers 2420, the number of acoustic transducers 2420 may be greater or less than ten. In some embodiments, using higher numbers of acoustic transducers 2420 may increase the amount of audio information collected and/or the sensitivity and accuracy of the audio information. In contrast, using a lower number of acoustic transducers 2420 may decrease the computing power required by the controller 2450 to process the collected audio information. In addition, the position of each acoustic transducer 2420 of the microphone array may vary. For example, the position of an acoustic transducer 2420 may include a defined position on the user, a defined coordinate on frame 2410, an orientation associated with each acoustic transducer, or some combination thereof.

Acoustic transducers 2420(A) and 2420(B) may be positioned on different parts of the user's ear, such as behind the pinna or within the auricle or fossa. Or, there may be additional acoustic transducers on or surrounding the ear in addition to acoustic transducers 2420 inside the ear canal. Having an acoustic transducer positioned next to an ear canal of a user may enable the microphone array to collect information on how sounds arrive at the ear canal. By positioning at least two of acoustic transducers 2420 on either side of a user's head (e.g., as binaural microphones), augmented-reality device 2400 may simulate binaural hearing and capture a 3D stereo sound field around about a user's head. In some embodiments, acoustic transducers 2420(A) and 2420(B) may be connected to augmented-reality system 2400 via a wired connection 2430, and in other embodiments, acoustic transducers 2420(A) and 2420(B) may be connected to augmented-reality system 2400 via a wireless connection (e.g., a Bluetooth connection). In still other embodiments, acoustic transducers 2420(A) and 2420(B) may not be used at all in conjunction with augmented-reality system 2400.

Acoustic transducers 2420 on frame 2410 may be positioned along the length of the temples, across the bridge, above or below display devices 2415(A) and 2415(B), or some combination thereof. Acoustic transducers 2420 may be oriented such that the microphone array is able to detect sounds in a wide range of directions surrounding the user wearing the augmented-reality system 2400. In some embodiments, an optimization process may be performed during manufacturing of augmented-reality system 2400 to determine relative positioning of each acoustic transducer 2420 in the microphone array.

In some examples, augmented-reality system 2400 may include or be connected to an external device (e.g., a paired device), such as neckband 2405. Neckband 2405 generally represents any type or form of paired device. Thus, the following discussion of neckband 2405 may also apply to various other paired devices, such as charging cases, smart watches, smart phones, wrist bands, other wearable devices, hand-held controllers, tablet computers, laptop computers and other external compute devices, etc.

As shown, neckband 2405 may be coupled to eyewear device 2402 via one or more connectors. The connectors may be wired or wireless and may include electrical and/or non-electrical (e.g., structural) components. In some cases, eyewear device 2402 and neckband 2405 may operate independently without any wired or wireless connection between them. While FIG. 24 illustrates the components of eyewear device 2402 and neckband 2405 in example locations on eyewear device 2402 and neckband 2405, the components may be located elsewhere and/or distributed differently on eyewear device 2402 and/or neckband 2405. In some embodiments, the components of eyewear device 2402 and neckband 2405 may be located on one or more additional peripheral devices paired with eyewear device 2402, neckband 2405, or some combination thereof.

Pairing external devices, such as neckband 2405, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2400 may be provided by a paired device or shared between a paired device and an eyewear device, thus reducing the weight, heat profile, and form factor of the eyewear device overall while still retaining desired functionality. For example, neckband 2405 may allow components that would otherwise be included on an eyewear device to be included in neckband 2405 since users may tolerate a heavier weight load on their shoulders than they would tolerate on their heads. Neckband 2405 may also have a larger surface area over which to diffuse and disperse heat to the ambient environment. Thus, neckband 2405 may allow for greater battery and computation capacity than might otherwise have been possible on a stand-alone eyewear device. Since weight carried in neckband 2405 may be less invasive to a user than weight carried in eyewear device 2402, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2405 may be communicatively coupled with eyewear device 2402 and/or to other devices. These other devices may provide certain functions (e.g., tracking, localizing, depth mapping, processing, storage, etc.) to augmented-reality system 2400. In the embodiment of FIG. 24, neckband 2405 may include two acoustic transducers (e.g., 2420(I) and 2420(J)) that are part of the microphone array (or potentially form their own microphone subarray). Neckband 2405 may also include a controller 2425 and a power source 2435.

Acoustic transducers 2420(I) and 2420(J) of neckband 2405 may be configured to detect sound and convert the detected sound into an electronic format (analog or digital). In the embodiment of FIG. 24, acoustic transducers 2420(I) and 2420(J) may be positioned on neckband 2405, thereby increasing the distance between the neckband acoustic transducers 2420(I) and 2420(J) and other acoustic transducers 2420 positioned on eyewear device 2402. In some cases, increasing the distance between acoustic transducers 2420 of the microphone array may improve the accuracy of beamforming performed via the microphone array. For example, if a sound is detected by acoustic transducers 2420(C) and 2420(D) and the distance between acoustic transducers 2420(C) and 2420(D) is greater than, e.g., the distance between acoustic transducers 2420(D) and 2420(E), the determined source location of the detected sound may be more accurate than if the sound had been detected by acoustic transducers 2420(D) and 2420(E).

Controller 2425 of neckband 2405 may process information generated by the sensors on 2405 and/or augmented-reality system 2400. For example, controller 2425 may process information from the microphone array that describes sounds detected by the microphone array. For each detected sound, controller 2425 may perform a direction-of-arrival (DOA) estimation to estimate a direction from which the detected sound arrived at the microphone array. As the microphone array detects sounds, controller 2425 may populate an audio data set with the information. In embodiments in which augmented-reality system 2400 includes an inertial measurement unit, controller 2425 may compute all inertial and spatial calculations from the IMU located on eyewear device 2402. A connector may convey information between augmented-reality system 2400 and neckband 2405 and between augmented-reality system 2400 and controller 2425. The information may be in the form of optical data, electrical data, wireless data, or any other transmittable data form. Moving the processing of information generated by augmented-reality system 2400 to neckband 2405 may reduce weight and heat in eyewear device 2402, making it more comfortable to the user.

Power source 2435 in neckband 2405 may provide power to eyewear device 2402 and/or to neckband 2405. Power source 2435 may include, without limitation, lithium ion batteries, lithium-polymer batteries, primary lithium batteries, alkaline batteries, or any other form of power storage. In some cases, power source 2435 may be a wired power source. Including power source 2435 on neckband 2405 instead of on eyewear device 2402 may help better distribute the weight and heat generated by power source 2435.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2500 in FIG. 25, that mostly or completely covers a user's field of view. Virtual-reality system 2500 may include a front rigid body 2502 and a band 2504 shaped to fit around a user's head. Virtual-reality system 2500 may also include output audio transducers 2506(A) and 2506(B). Furthermore, while not shown in FIG. 25, front rigid body 2502 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2500 and/or virtual-reality system 2500 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 2400 and/or virtual-reality system 2500 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2300, augmented-reality system 2400, and/or virtual-reality system 2500 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 23 and 25, output audio transducers 2308(A), 2308(B), 2506(A), and 2506(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2310 may include condenser microphones, dynamic microphones, ribbon microphones, and/or any other type or form of input transducer. In some embodiments, a single transducer may be used for both audio input and audio output.

Figure 25:
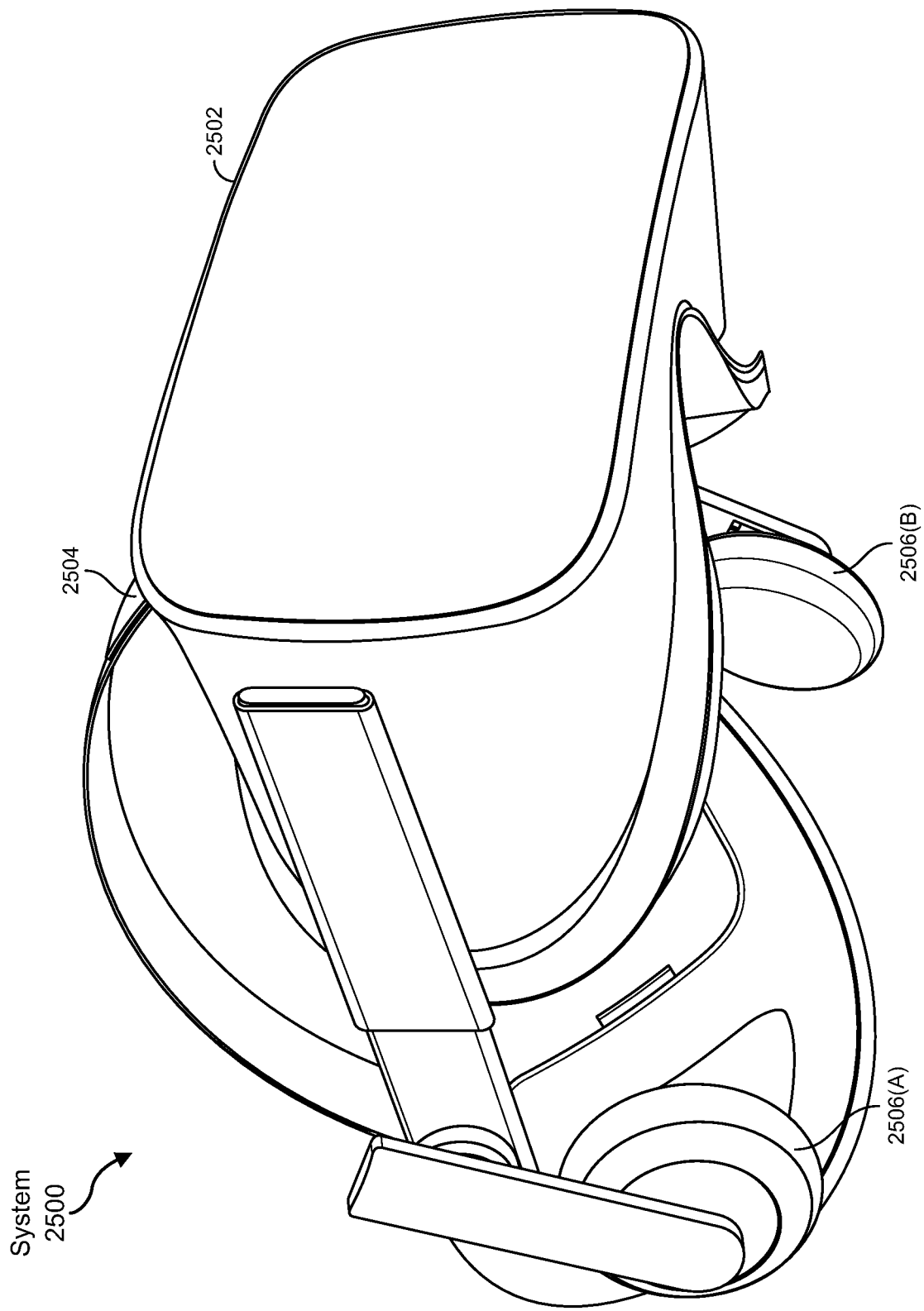
FIG. 25 is an illustration of an exemplary virtual-reality headset that may be used in connection with embodiments of this disclosure.

While not shown in FIGS. 23-25, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. An optical element, comprising:
   a primary electrode;
   a secondary electrode overlapping at least a portion of the primary electrode; and
   an electrostrictive layer disposed between and abutting the primary electrode and the secondary electrode, the electrostrictive ceramic produced by:
      forming a lead free partial powder mixture;
      calcining the partial powder mixture;
      adding lead oxide to the calcined partial powder mixture to form a powder mixture; and
      sintering the powder mixture to form an electrostrictive ceramic, wherein the electrostrictive layer comprises:
         a relative density of at least approximately 99%;
         an average grain size of at least approximately 300 nm;
         a transmissivity within the visible spectrum of at least approximately 70%; and
         bulk haze of less than approximately 10%.
2. The optical element of claim 1, wherein the electrostrictive layer further comprises an optical clarity of at least approximately 70%.
3. The optical element of claim 1, wherein the electrostrictive layer further comprises an optical reflectivity of less than approximately 30%.

4. The optical element of claim 1, when exposed to a non-zero electric field of up to 2 MV/m, comprises at least one of:
- less than a 50% change in the transmissivity;
- a change in the bulk haze of less than 50%, and
- a change in clarity of less than 50%.

5. The optical element of claim 1, wherein the electrostrictive layer comprises less than a 50% change in each of transparency, bulk haze, and clarity when a voltage is applied to the primary electrode.

6. The optical element of claim 1, wherein the electrostrictive layer comprises at least one compound selected from the group consisting of barium titanium zirconium oxide, barium titanium tin oxide, barium strontium titanium oxide, barium zirconium oxide, lead magnesium titanium oxide, lead magnesium niobium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, and bismuth zinc tantalum oxide.

7. The optical element of claim 6, wherein the electrostrictive layer further comprises one or more of strontium titanium oxide, calcium titanium oxide, lead titanium oxide, lead zirconium titanium oxide, barium titanium oxide, bismuth iron oxide, sodium bismuth titanium oxide, bismuth scandium oxide, bismuth titanium oxide, lithium tantalum oxide, sodium potassium niobium oxide, and lithium niobium oxide.

8. The optical element of claim 1, wherein the electrostrictive layer further comprises at least one dopant selected from the group consisting of niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

9. The optical element of claim 1, wherein the electrostrictive layer comprises an RMS surface roughness of less than approximately 50 nm.

10. The optical element of claim 1, wherein the electrostrictive layer comprises a cubic phase.

11. The optical element of claim 1, wherein the electrostrictive layer comprises a polar nanoregion.

12. A head-mounted display comprising the optical element of claim 1.

13. An optical element, comprising:
a transparent primary electrode;
a transparent secondary electrode overlapping at least a portion of the transparent primary electrode; and
an electrostrictive ceramic layer disposed between and abutting the transparent primary electrode and the transparent secondary electrode, the electrostrictive ceramic produced by:
forming a lead free partial powder mixture;
calcining the partial powder mixture;
adding lead oxide to the calcined partial powder mixture to form a powder mixture; and
sintering the powder mixture to form an electrostrictive ceramic, wherein the electrostrictive layer comprises:
a transmissivity within the visible spectrum of at least approximately 70%;
bulk haze of less than approximately 10%;
optical clarity of at least approximately 70%; and
optical reflectivity of less than approximately 30%.

14. The optical element of claim 13, wherein the electrostrictive layer further comprises a relative density of at least approximately 99.5% and an average grain size of at least approximately 300 nm.

15. The optical element of claim 13, wherein the electrostrictive ceramic layer further comprises a relative density of at least approximately 99.995%, an average pore size of less than approximately 50 nm, and a transmissivity within the visible spectrum of at least approximately 90%.

16. A method comprising:
forming a lead free partial powder mixture;
calcining the partial powder mixture;
adding lead oxide to the calcined partial powder mixture to form a powder mixture; and
sintering the powder mixture to form an electrostrictive ceramic, wherein the electrostrictive ceramic comprises:
a relative density of at least approximately 99.5%;
a transmissivity within the visible spectrum of at least approximately 70%; and
bulk haze of less than approximately 10%.

17. The method of claim 16, wherein the electrostrictive ceramic comprises an average grain size of at least approximately 300 nm.

18. The method of claim 16, further comprising forming a transparent electrode over the electrostrictive ceramic.

19. The method of claim 16, further comprising forming a transparent electrode over opposing surface of the electrostrictive ceramic.

* * * * *